(12) United States Patent
Cheng et al.

(10) Patent No.: US 11,646,293 B2
(45) Date of Patent: May 9, 2023

(54) SEMICONDUCTOR STRUCTURE AND METHOD

(71) Applicant: Taiwan Semiconductor Manufacturing Co., Ltd., Hsinchu (TW)

(72) Inventors: Chia-Shen Cheng, Hsinchu (TW); Wei-Yu Chen, Taipei (TW); Philip Yu-Shuan Chung, Taipei (TW); Hsiu-Jen Lin, Zhubei (TW); Ching-Hua Hsieh, Hsinchu (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 177 days.

(21) Appl. No.: 16/935,465

(22) Filed: Jul. 22, 2020

(65) Prior Publication Data
US 2022/0028823 A1   Jan. 27, 2022

(51) Int. Cl.
*H01L 23/00* (2006.01)
(52) U.S. Cl.
CPC .............. *H01L 24/81* (2013.01); *H01L 24/13* (2013.01); *H01L 24/75* (2013.01); *H01L 2224/81224* (2013.01); *H01L 2224/81939* (2013.01)
(58) Field of Classification Search
CPC ......... H01L 24/81; H01L 24/13; H01L 24/75; H01L 2224/81224; H01L 2224/81939; B23K 26/066
USPC ........................................................ 438/455
See application file for complete search history.

(56) References Cited

U.S. PATENT DOCUMENTS

| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |

(Continued)

FOREIGN PATENT DOCUMENTS

| CN | 1588634 A | 3/2005 |
| TW | 201608651 A | 3/2016 |
| TW | 201731054 A | 9/2017 |

*Primary Examiner* — Nduka E Ojeh
*Assistant Examiner* — Laura M Dykes
(74) *Attorney, Agent, or Firm* — Slater Matsil, LLP

(57) ABSTRACT

A method for bonding semiconductor substrates includes placing a die on a substrate and performing a heating process on the die and the substrate to bond the respective first connectors with the respective second connectors. Respective first connectors of a plurality of first connectors on the die contact respective second connectors of a plurality of second connectors on the substrate. The heating process includes placing a mask between a laser generator and the substrate and performing a laser shot. The mask includes a masking layer and a transparent layer. Portions of the masking layer are opaque. The laser passes through a first gap in the masking layer and through the transparent layer to heat a first portion of a top side of the die opposite the substrate.

20 Claims, 24 Drawing Sheets

(56) References Cited

U.S. PATENT DOCUMENTS

| | | | |
|---|---|---|---|
| 9,543,170 B2 | 1/2017 | Yu et al. | |
| 10,193,038 B2 | 1/2019 | Farrens et al. | |
| 2014/0193952 A1 | 7/2014 | Lin et al. | |
| 2015/0357318 A1 | 12/2015 | Chen et al. | |
| 2017/0250171 A1 | 8/2017 | Yu et al. | |
| 2017/0301560 A1 | 10/2017 | Yoon et al. | |
| 2018/0130683 A1* | 5/2018 | Hendriks | H01L 21/683 |
| 2018/0366433 A1* | 12/2018 | Ahn | H01L 24/81 |
| 2019/0103376 A1* | 4/2019 | Han | B23K 1/0056 |
| 2019/0279958 A1 | 9/2019 | Chen et al. | |
| 2019/0296002 A1 | 9/2019 | Pei et al. | |
| 2019/0348392 A1* | 11/2019 | Chen | H01L 24/98 |

\* cited by examiner

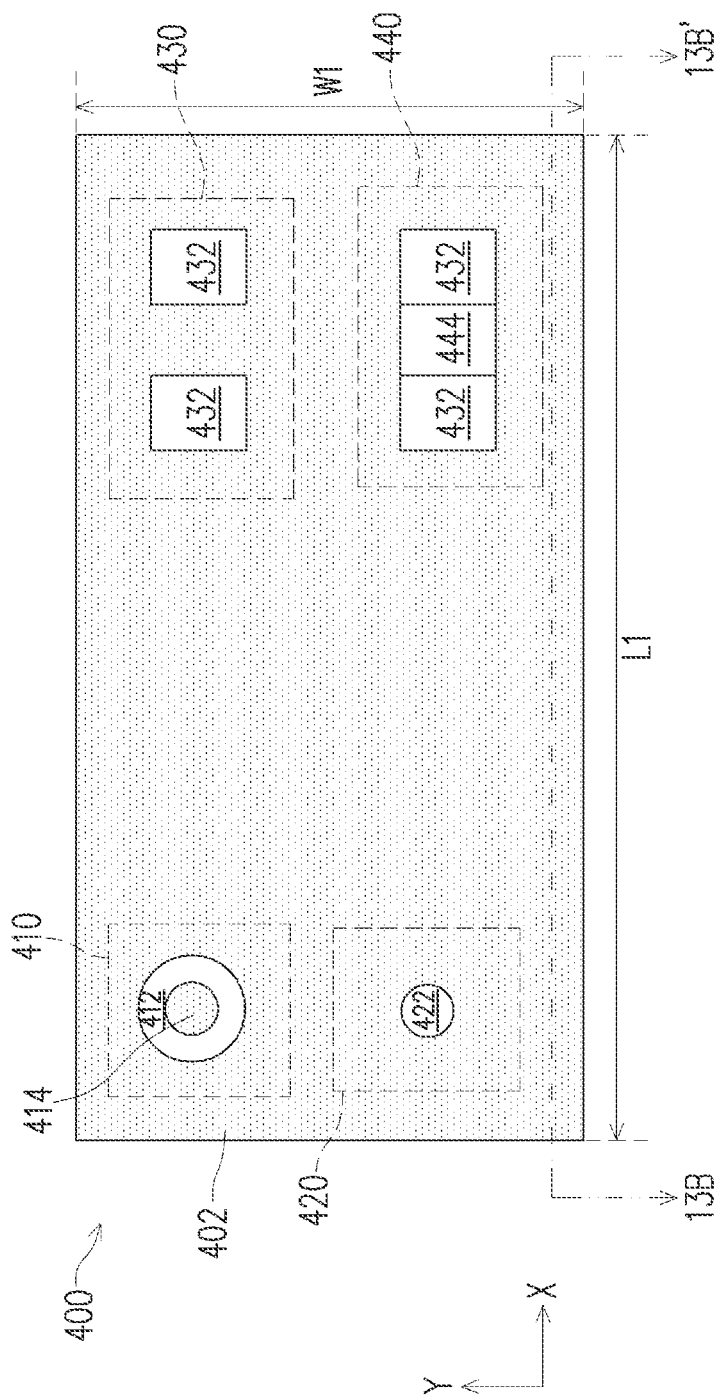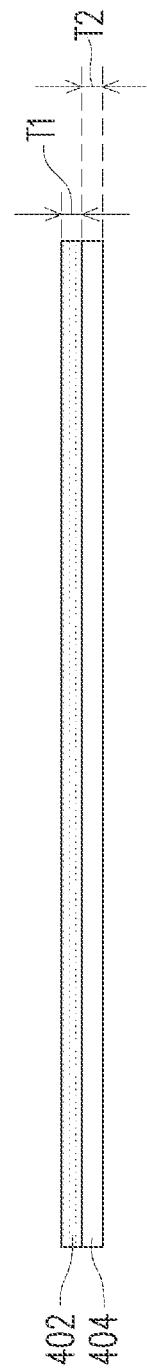
FIG. 13A
FIG. 13B

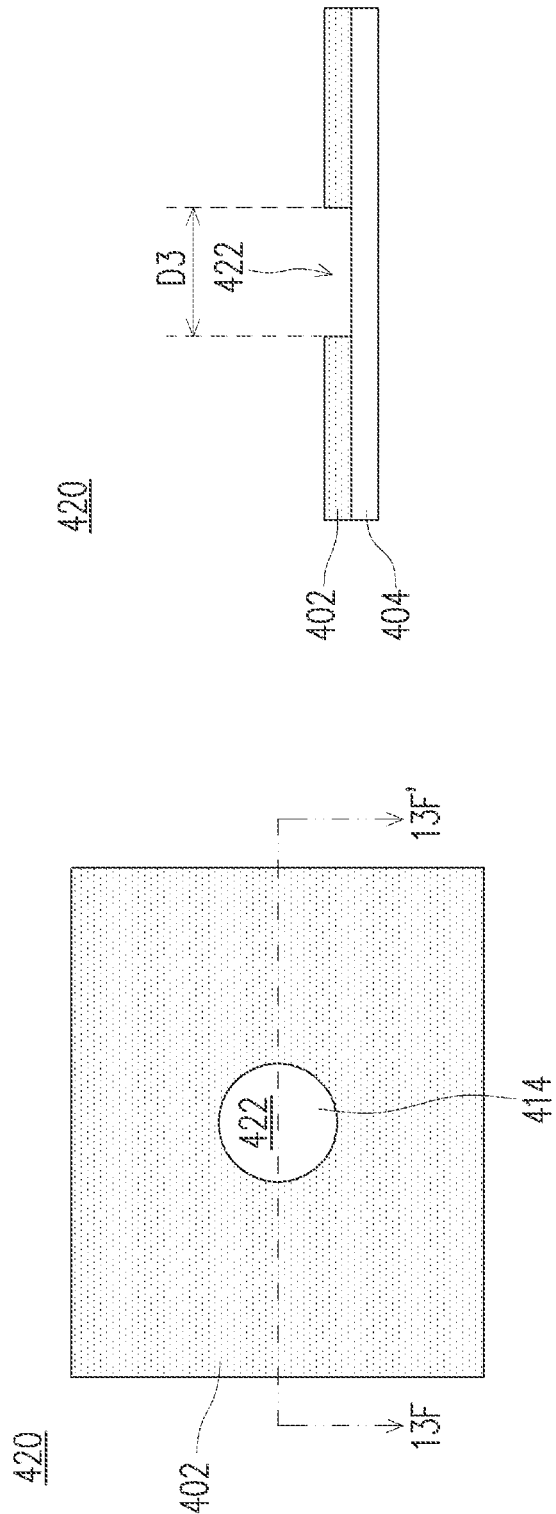

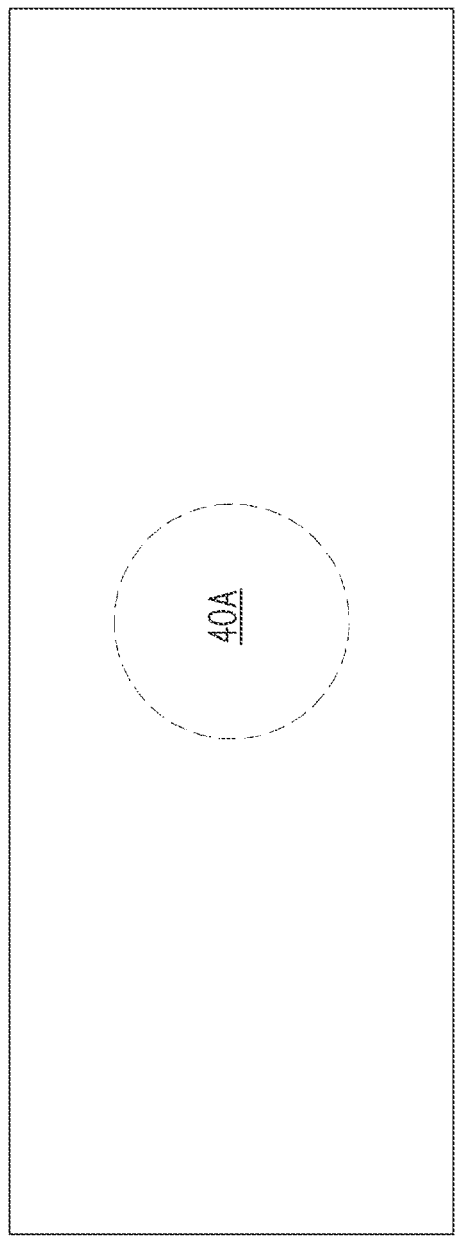

SEMICONDUCTOR STRUCTURE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 12 and 14A through 18 are cross-sectional views of intermediate steps during a process for forming device packages, in accordance with some embodiments. FIGS. 13A through 13J are top and cross-sectional views of a masking apparatus, in accordance with some embodiments.

DETAILED DESCRIPTION

Figure 1:
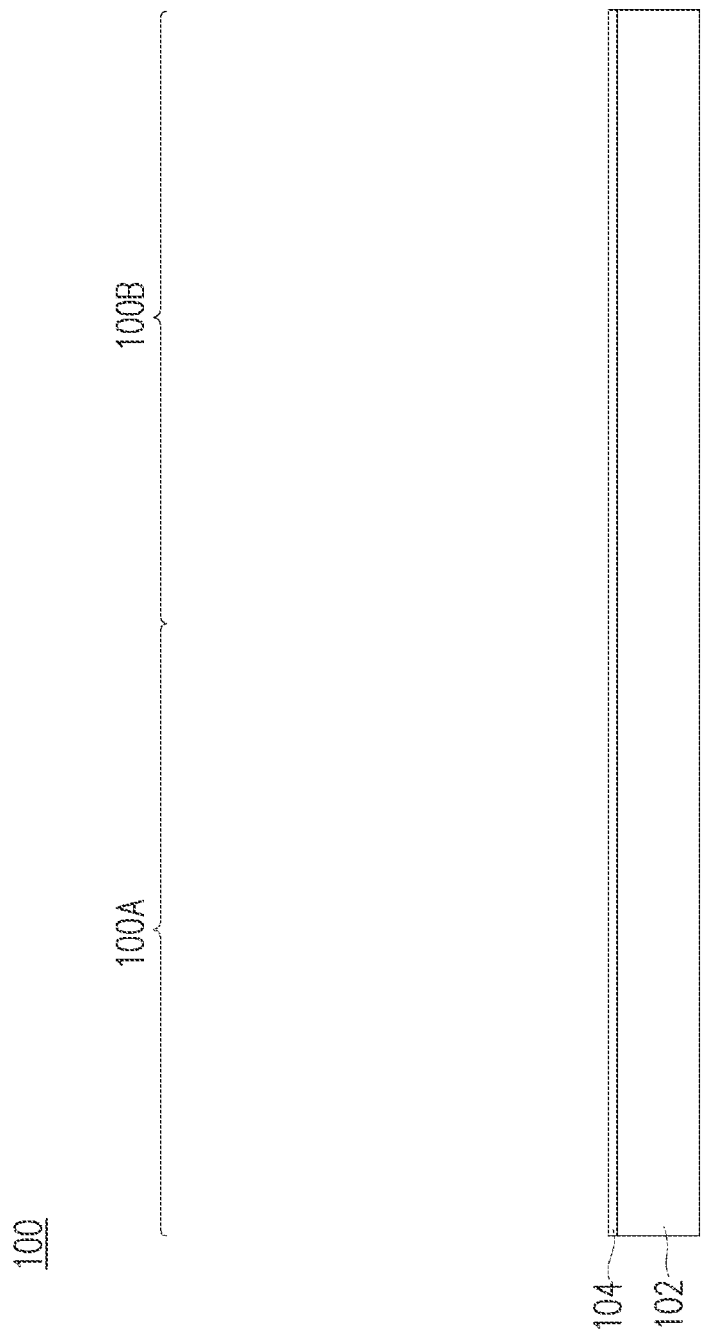

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a first package component is bonded to a second package component by a laser assisted bonding (LAB) process. The first and second package components may be, e.g., wafers, and each contain a plurality of package regions. In the LAB process, the package regions of the package components are sequentially heated by a laser beam. A masking apparatus comprising a masking layer and a transparent mounting layer is placed between the laser beam emitter and the top surface of the top package component. The masking apparatus is used to restrict the laser beam to heating particular package regions by allowing laser shots to pass through openings in the masking laser and hit target package regions. The LAB process allows the first and second package components to be bonded together by directly heating only the top package component. Indirect heating of the bottom package component may be reduced, which may help reduce wafer warpage. Manufacturing throughput may also be increased through the faster heating afforded by laser heating with different types laser beam and heating profiles that may be configured by moving the position of the masking apparatus. Although embodiments of the LAB process with a multilayer masking apparatus are described with respect to the bonding of two package components, any suitable substrates may be bonded with the disclosed process and apparatus, such as e.g. two wafers, two dies, or a wafer and a die.

FIGS. 1 through 10 illustrate cross-sectional views of intermediate steps during a process for forming a first package component 100, in accordance with some embodiments. A first package region 100A and a second package region 100B are illustrated, and a first package 101 (see FIG. 18) is formed in each of the package regions 100A and 100B. The first packages 101 may also be referred to as integrated fan-out (InFO) packages.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 2:
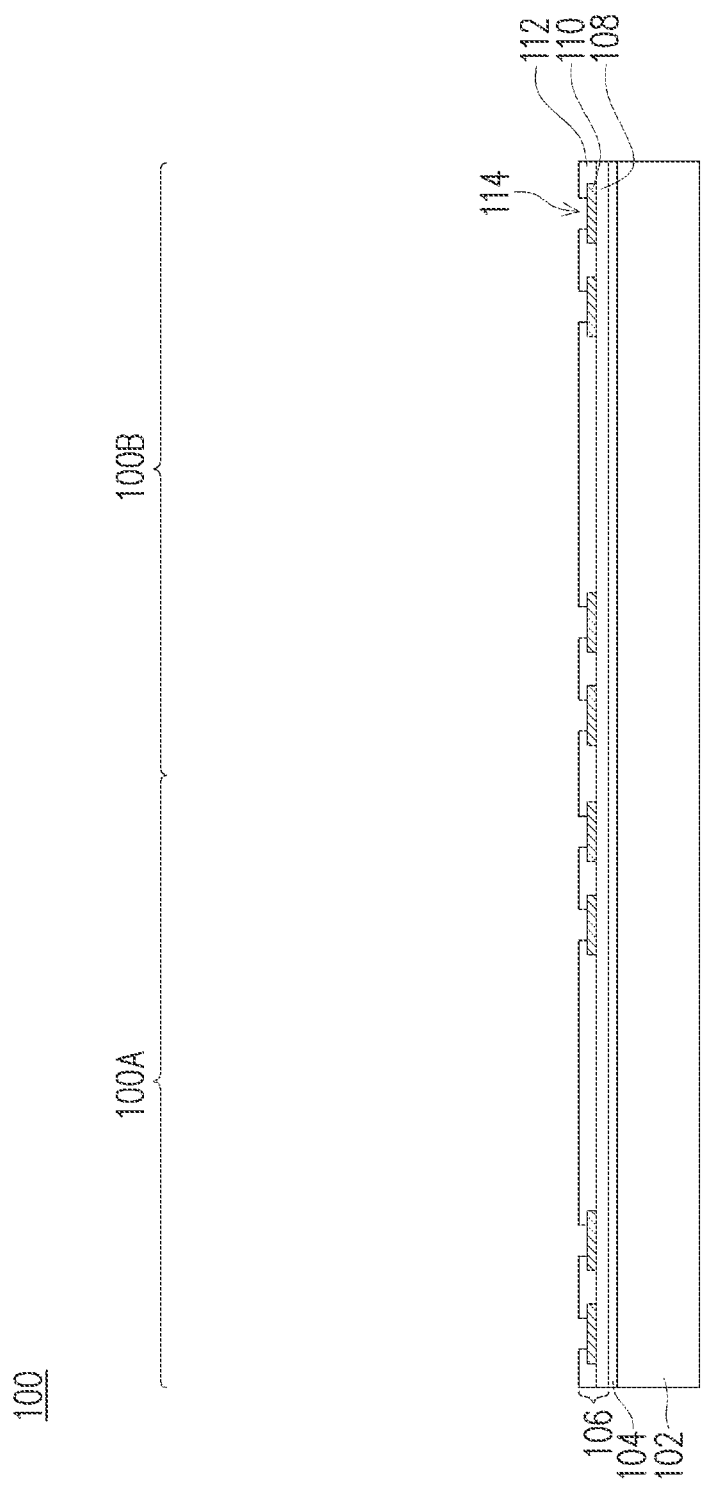

In FIG. 2, a back-side redistribution structure 106 is formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional, and in some embodiments only the dielectric layer 108 is formed.

The dielectric layer 108 is formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 is formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 is formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be by an acceptable process, such as by exposing the dielectric layer 112 to light when the dielectric layer 112 is a photo-sensitive material or by etching using, for example, an anisotropic etch.

It should be appreciated that the back-side redistribution structure 106 may include any number of dielectric layers and metallization patterns. Additional dielectric layers and metallization patterns may be formed by repeating the processes for forming the metallization pattern 110 and dielectric layer 112. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 3:
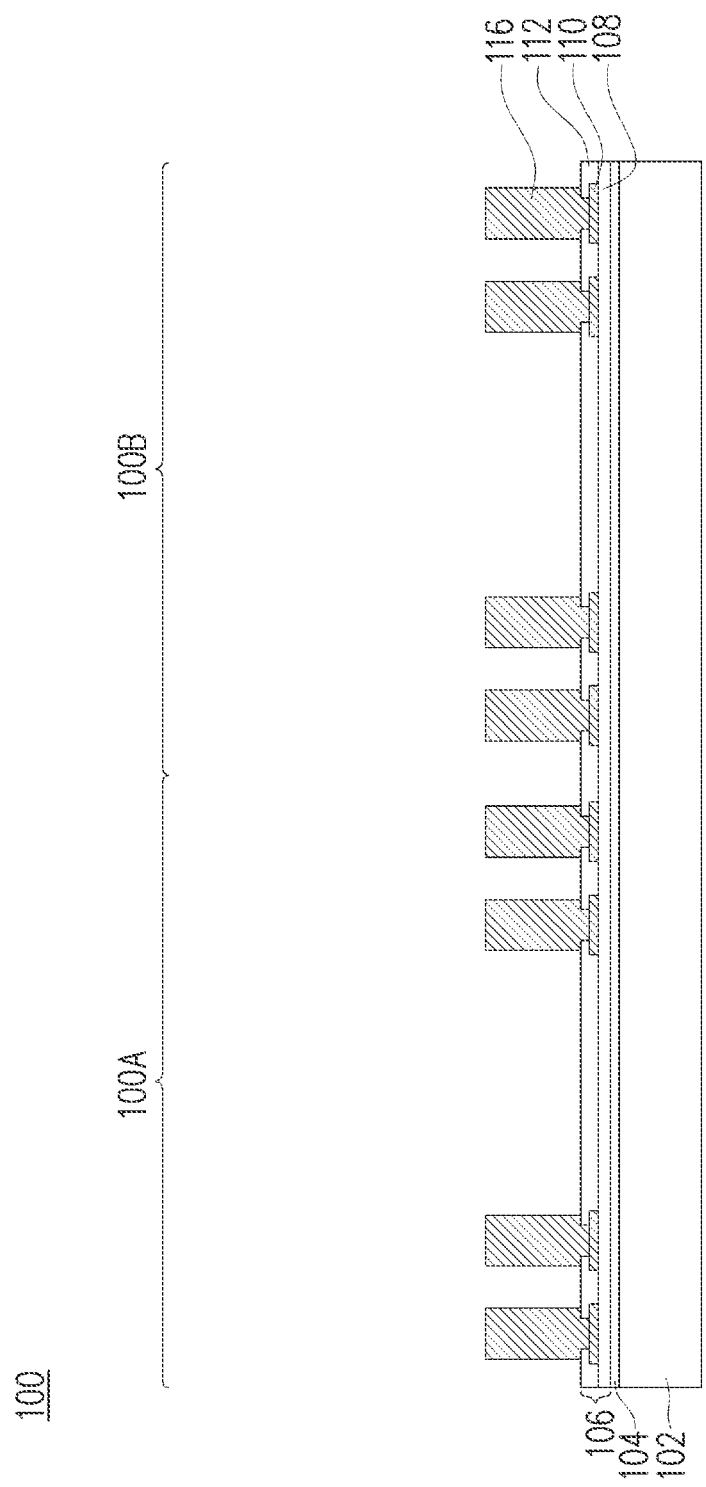

In FIG. 3, through vias 116 are formed in the openings 114 and extending away from the topmost dielectric layer of the back-side redistribution structure 106 (e.g., the dielectric layer 112 in the illustrated embodiment). As an example to form the through vias 116, a seed layer is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 4:
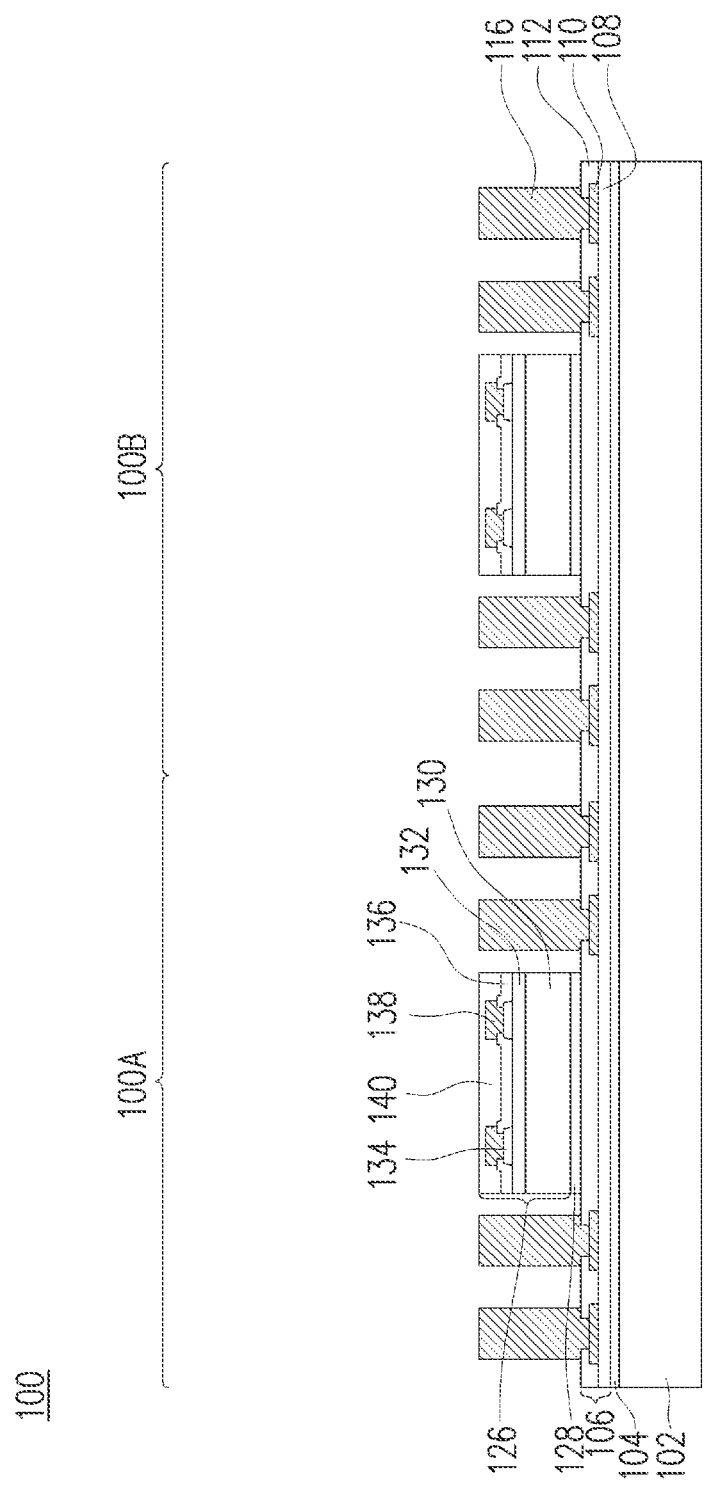

In FIG. 4, integrated circuit dies 126 are adhered to the dielectric layer 112 by an adhesive 128. The integrated circuit dies 126 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 126 may be different sizes (e.g., different heights and/or surface areas), and in other embodiments, the integrated circuit dies 126 may be the same size (e.g., same heights and/or surface areas).

Before being adhered to the dielectric layer 112, the integrated circuit dies 126 may be processed according to applicable manufacturing processes to form integrated circuits in the integrated circuit dies 126. For example, the integrated circuit dies 126 each include a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

The integrated circuit dies 126 further comprise pads 134, such as aluminum pads, to which external connections are made. The pads 134 are on what may be referred to as respective active sides of the integrated circuit dies 126. Passivation films 136 are on the integrated circuit dies 126 and on portions of the pads 134. Openings extend through the passivation films 136 to the pads 134. Die connectors 138, such as conductive pillars (for example, comprising a metal such as copper), extend through the openings in the passivation films 136 and are mechanically and electrically coupled to the respective pads 134. The die connectors 138 may be formed by, for example, plating, or the like. The die connectors 138 electrically couple the respective integrated circuits of the integrated circuit dies 126.

A dielectric material 140 is on the active sides of the integrated circuit dies 126, such as on the passivation films 136 and the die connectors 138. The dielectric material 140 laterally encapsulates the die connectors 138, and the dielectric material 140 is laterally coterminous with the respective integrated circuit dies 126. The dielectric material 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 128 is on back-sides of the integrated circuit dies 126 and adheres the integrated circuit dies 126 to the back-side redistribution structure 106, such as the dielectric layer 112. The adhesive 128 may be any suitable adhesive, epoxy, die attach film (DAF), or the like. The adhesive 128 may be applied to a back-side of the integrated circuit dies 126 or may be applied over the surface of the carrier substrate 102. For example, the adhesive 128 may be applied to the back-side of the integrated circuit dies 126 before singulating to separate the integrated circuit dies 126.

Although one integrated circuit die 126 is illustrated as being adhered in each of the first package region 100A and the second package region 100B, it should be appreciated that more integrated circuit dies 126 may be adhered in each package region. For example, multiple integrated circuit dies 126 may be adhered in each region. Further, the integrated circuit dies 126 may vary in size. In some embodiments, the integrated circuit die 126 may be dies with a large footprint, such as system-on-chip (SoC) devices. In embodiments where the integrated circuit die 126 have a large footprint, the space available for the through vias 116 in the package regions may be limited. Use of the back-side redistribution structure 106 allows for an improved interconnect arrangement when the package regions have limited space available for the through vias 116.

Figure 5:
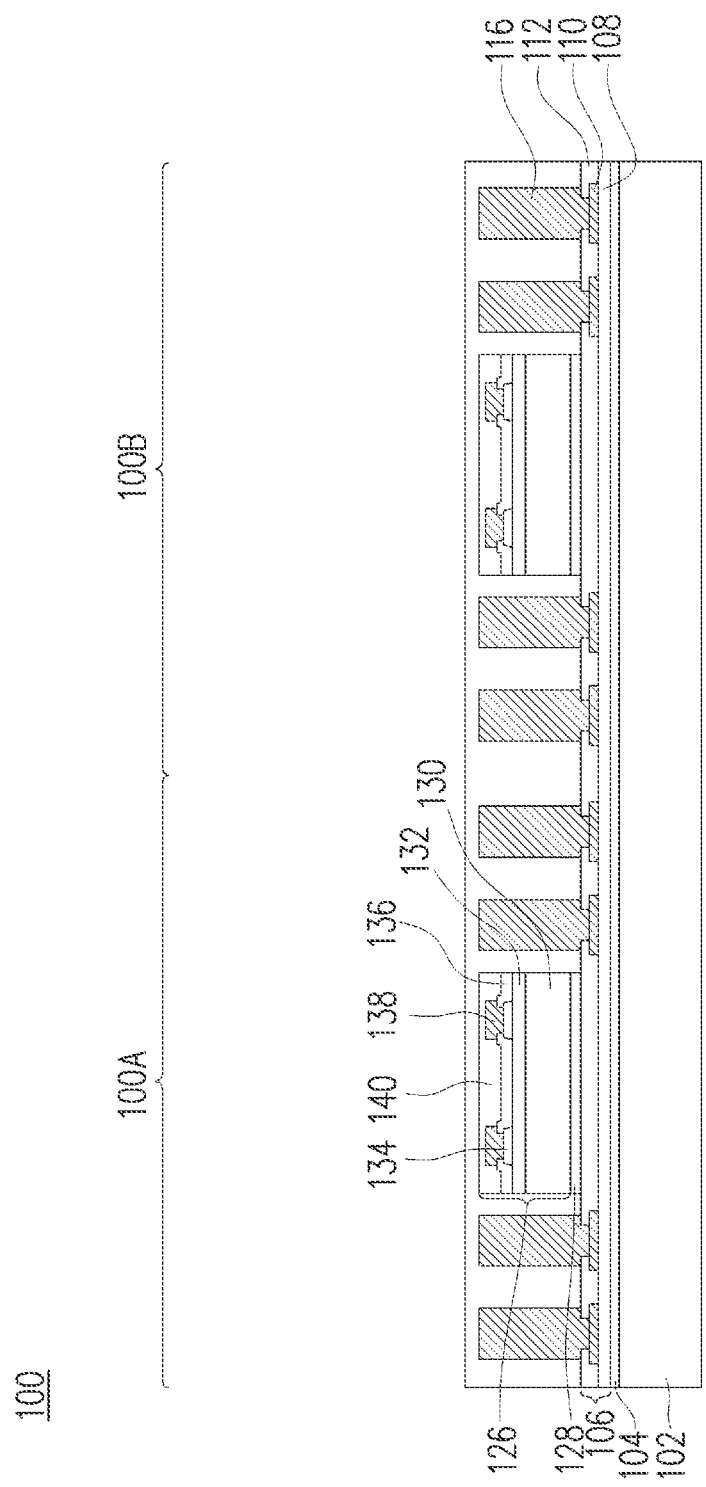

In FIG. 5, an encapsulant 142 is formed on the various components. After formation, the encapsulant 142 laterally encapsulates the through vias 116 and integrated circuit dies 126. The encapsulant 142 may be a molding compound, epoxy, or the like. The encapsulant 142 may be applied by compression molding, transfer molding, or the like, and may be formed over the carrier substrate 102 such that the through vias 116 and/or the integrated circuit dies 126 are buried or covered. The encapsulant 142 is then cured.

Figure 6:
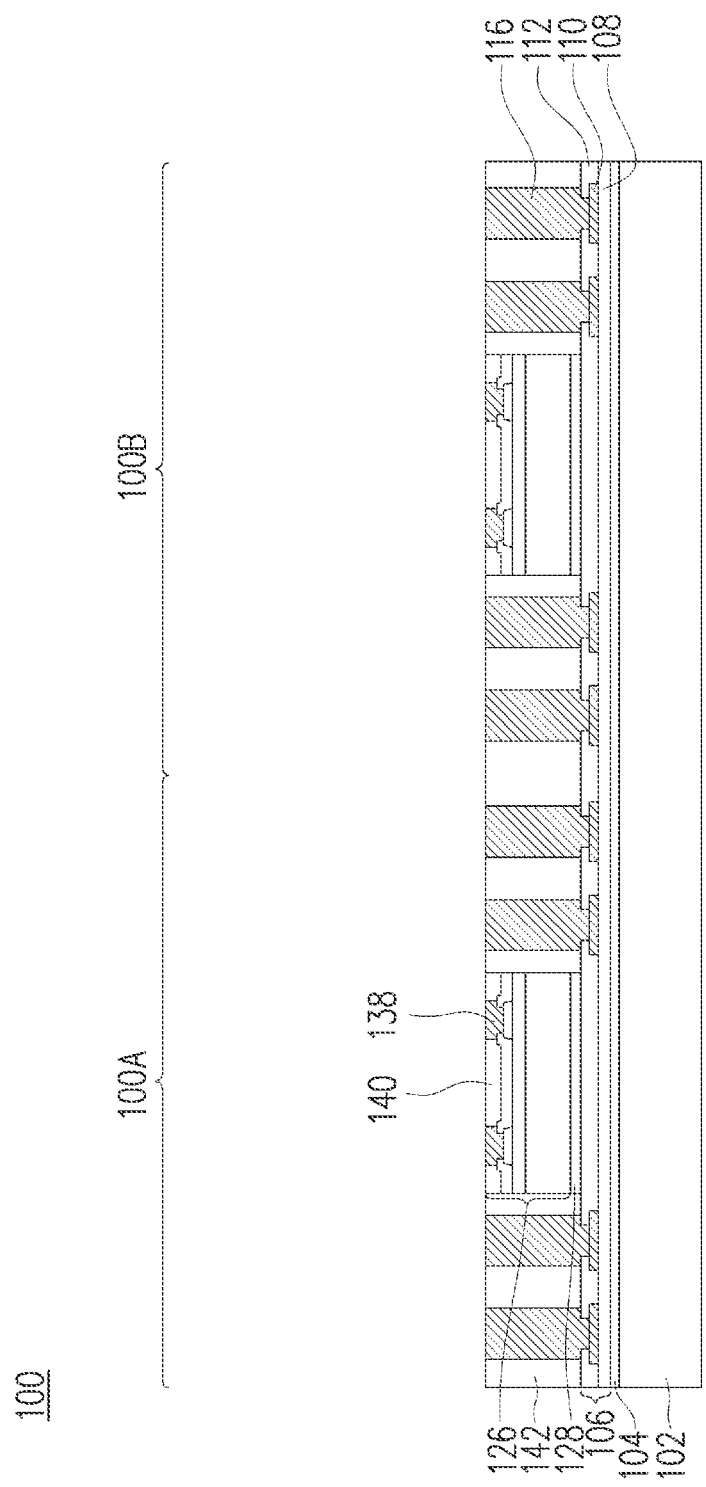

In FIG. 6, a planarization process is performed on the encapsulant 142 to expose the through vias 116 and the die connectors 138. The planarization process may also grind the dielectric material 140. Top surfaces of the through vias 116, die connectors 138, dielectric material 140, and encapsulant 142 are coplanar after the planarization process. The planarization process may be, for example, a chemical-mechanical polish (CMP), a grinding process, or the like. In some embodiments, the planarization may be omitted, for example, if the through vias 116 and die connectors 138 are already exposed.

Figure 7:
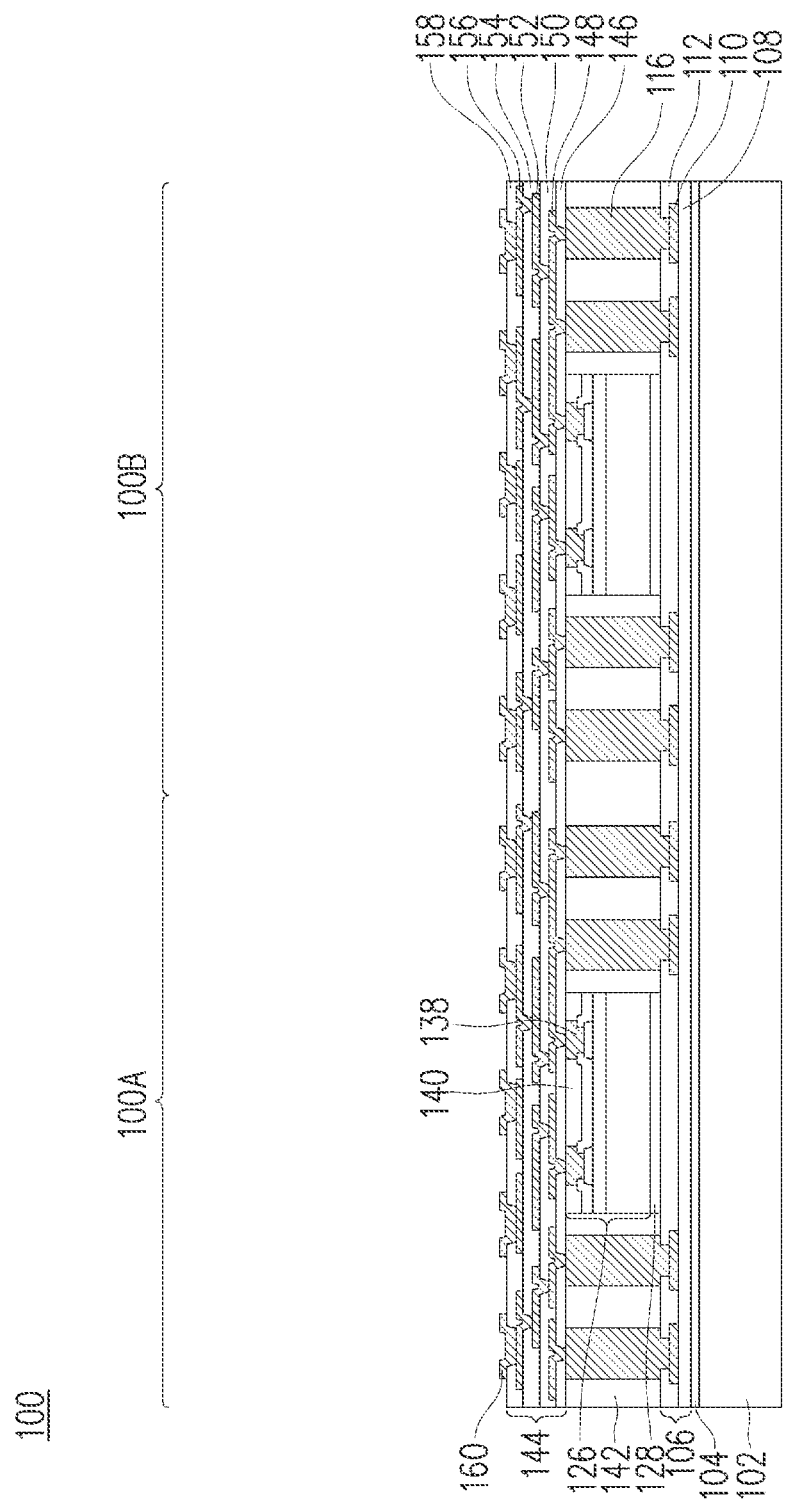

In FIG. 7, a front-side redistribution structure 144 is formed over the through vias 116, encapsulant 142, and integrated circuit dies 126. The front-side redistribution structure 144 includes dielectric layers 146, 150, 154, and 158; metallization patterns 148, 152, and 156; and under bump metallurgies (UBMs) 160. The metallization patterns may also be referred to as redistribution layers or redistribution lines. The front-side redistribution structure 144 is shown as an example. More or fewer dielectric layers and metallization patterns may be formed in the front-side redistribution structure 144. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 144, the dielectric layer 146 is deposited on the encapsulant 142, through vias 116, and die connectors 138. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms openings exposing portions of the through vias 116 and the die connectors 138. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 can be developed after the exposure.

The metallization pattern 148 is then formed. The metallization pattern 148 includes conductive lines on and extending along the major surface of the dielectric layer 146. The metallization pattern 148 further includes conductive vias extending through the dielectric layer 146 to be physically and electrically connected to the through vias 116 and the integrated circuit dies 126. To form the metallization pattern 148, a seed layer is formed over the dielectric layer 146 and in the openings extending through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 148. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 148. The photo resist and portions of the seed layer on which the conductive material is not formed are removed.

The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

The dielectric layer 150 is deposited on the metallization pattern 148 and dielectric layer 146. The dielectric layer 150 may be formed in a manner similar to the dielectric layer 146, and may be formed of the same material as the dielectric layer 146.

The metallization pattern 152 is then formed. The metallization pattern 152 includes conductive lines on and extending along the major surface of the dielectric layer 150. The metallization pattern 152 further includes conductive vias extending through the dielectric layer 150 to be physically and electrically connected to the metallization pattern 148. The metallization pattern 152 may be formed in a manner similar to the metallization pattern 148, and may be formed of the same material as the metallization pattern 148.

The dielectric layer 154 is deposited on the metallization pattern 152 and dielectric layer 150. The dielectric layer 154 may be formed in a manner similar to the dielectric layer 146, and may be formed of the same material as the dielectric layer 146.

The metallization pattern 156 is then formed. The metallization pattern 156 includes conductive lines on and extending along the major surface of the dielectric layer 154. The metallization pattern 156 further includes conductive vias extending through the dielectric layer 154 to be physically and electrically connected to the metallization pattern 152. The metallization pattern 156 may be formed in a manner similar to the metallization pattern 148, and may be formed of the same material as the metallization pattern 148.

The dielectric layer 158 is deposited on the metallization pattern 156 and dielectric layer 154. The dielectric layer 158 may be formed in a manner similar to the dielectric layer 146, and may be formed of the same material as the dielectric layer 146.

The UBMs 160 are optionally formed on and extending through the dielectric layer 158. As an example to form the UBMs 160, the dielectric layer 158 may be patterned to form openings exposing portions of the metallization pattern 156. The patterning may be by an acceptable process, such as by exposing the dielectric layer 158 to light when the dielectric layer 158 is a photo-sensitive material or by etching using, for example, an anisotropic etch. If the dielectric layer 158 is a photo-sensitive material, the dielectric layer 158 can be developed after the exposure. The openings for the UBMs 160 may be wider than the openings for the conductive via portions of the metallization patterns 148, 152, and 156. A seed layer is formed over the dielectric layer 158 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 160. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 160. In embodiments where the UBMs 160 are formed differently, more photoresist and patterning steps may be utilized.

Figure 8:
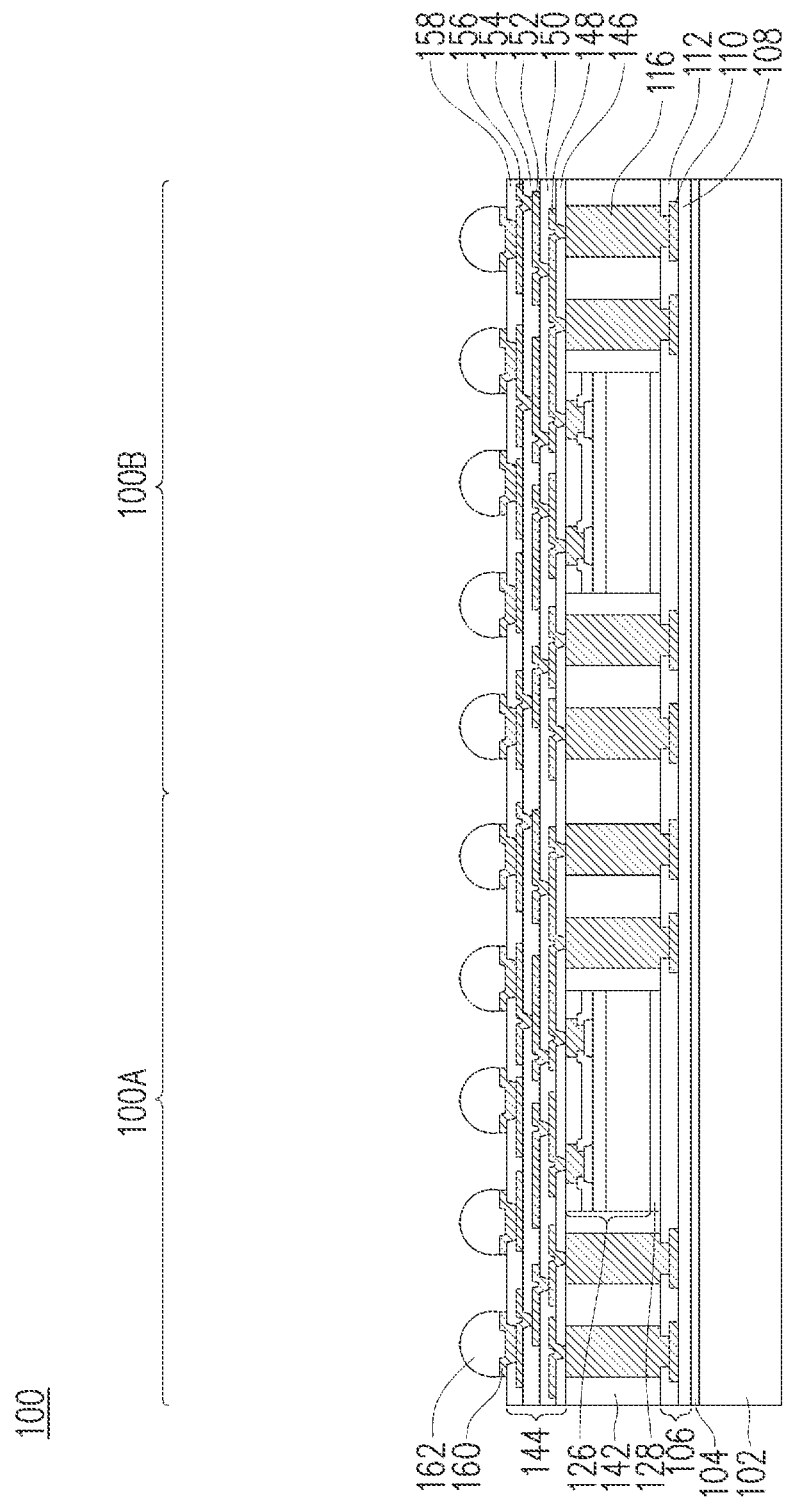

In FIG. 8, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 may include a conductive material such as solder, copper, aluminum, gold, nickel, silver, palladium, tin, the like, or a combination thereof. In some embodiments, the conductive connectors 162 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 162 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 9:
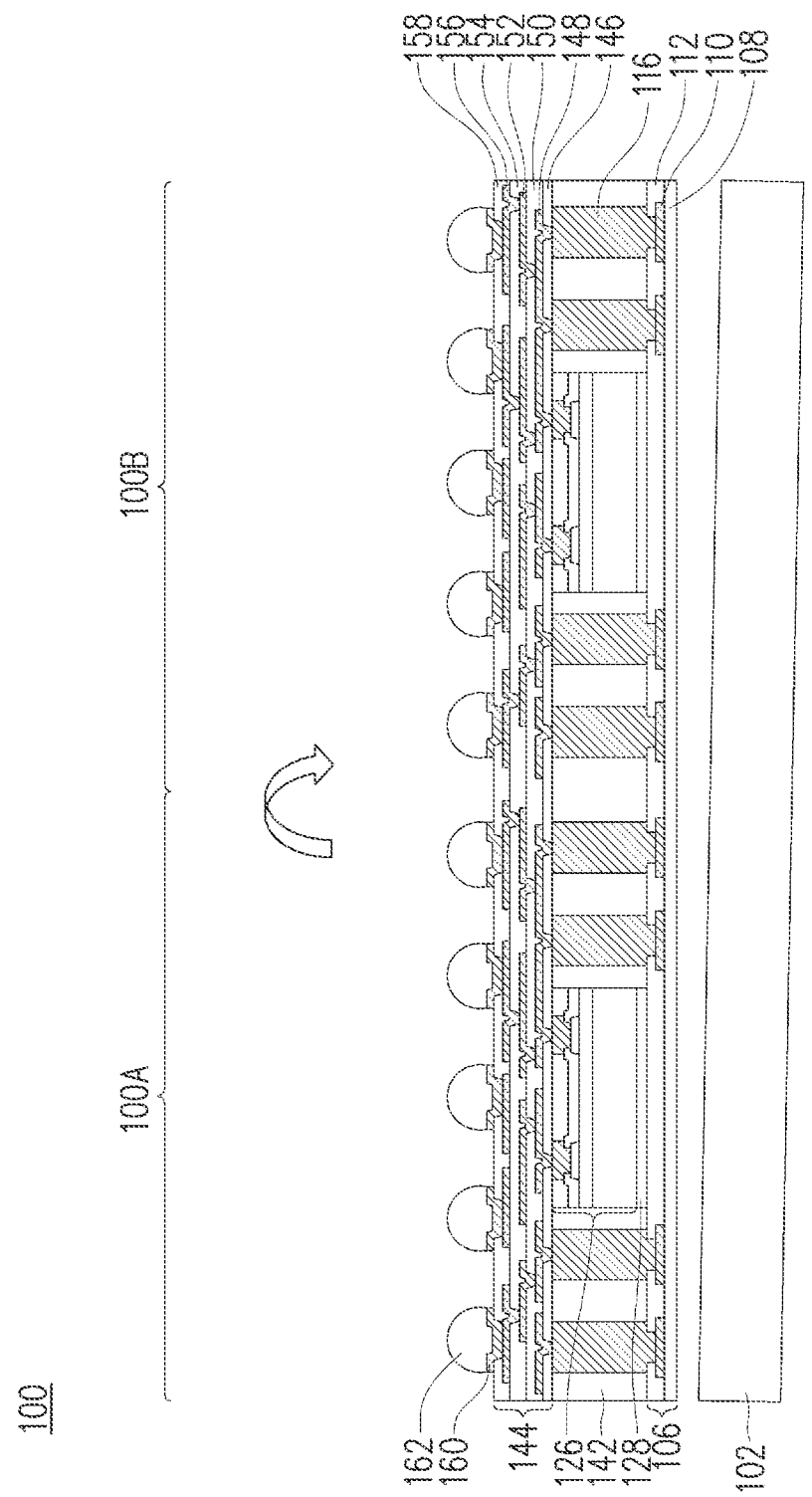

In FIG. 9, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 10:
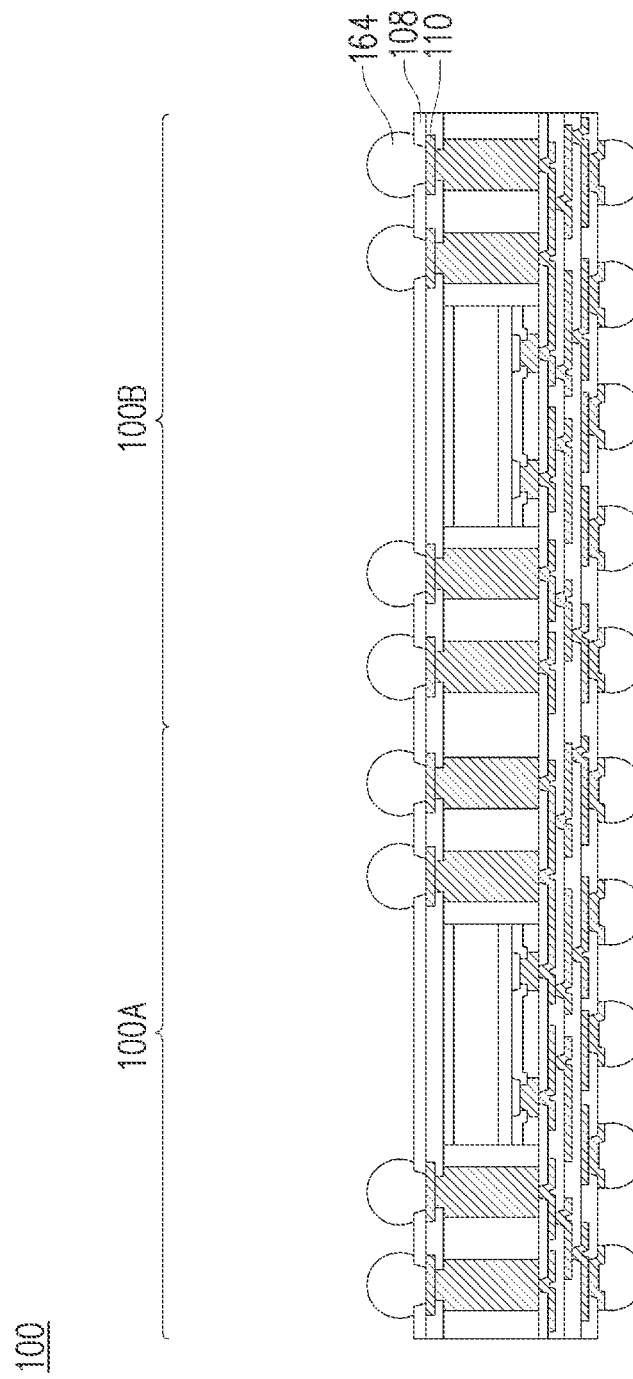

In FIG. 10, conductive connectors 164 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 164 are formed in the openings. In some embodiments, the conductive connectors 164 comprise flux and are formed in a flux dipping process. In some embodiments, the conductive connectors 164 comprise a conductive paste such as solder paste, silver paste, or the like, and are dispensed in a printing process. In some embodiments, the conductive connectors 164 are formed in a manner similar to the conductive connectors 162, and may be formed of the same material as the conductive connectors 162.

FIGS. 11 through 18 illustrate cross-sectional views of intermediate steps during a process for bonding the first package component 100 to a second package component 200, in accordance with some embodiments. A first package region 200A and a second package region 200B are illustrated, and a second package 201 (see FIG. 18) is formed in each of the package regions 200A and 200B.

Figure 11:
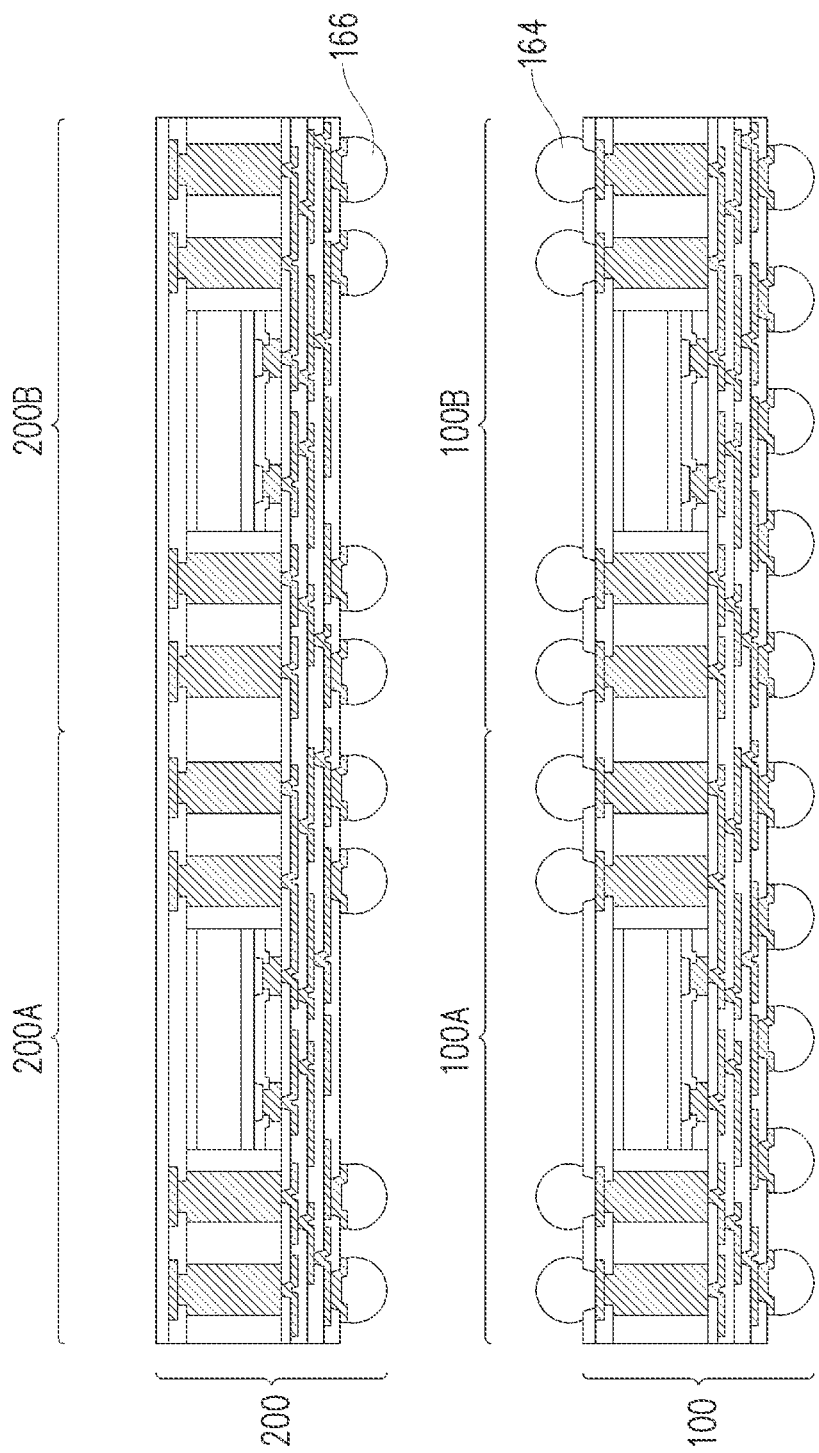

In FIG. 11, the second package component 200 is provided or produced. In the embodiment shown, the same types of packages are formed in the package components 100 and 200. In some embodiments, different types of packages are formed in the package components 100 and 200. In the embodiment shown, the package components 100 and 200 are both InFO packages. The second package component 200 has conductive connectors 166, which are similar to the conductive connectors 162 of the first package component 100.

Figure 12:
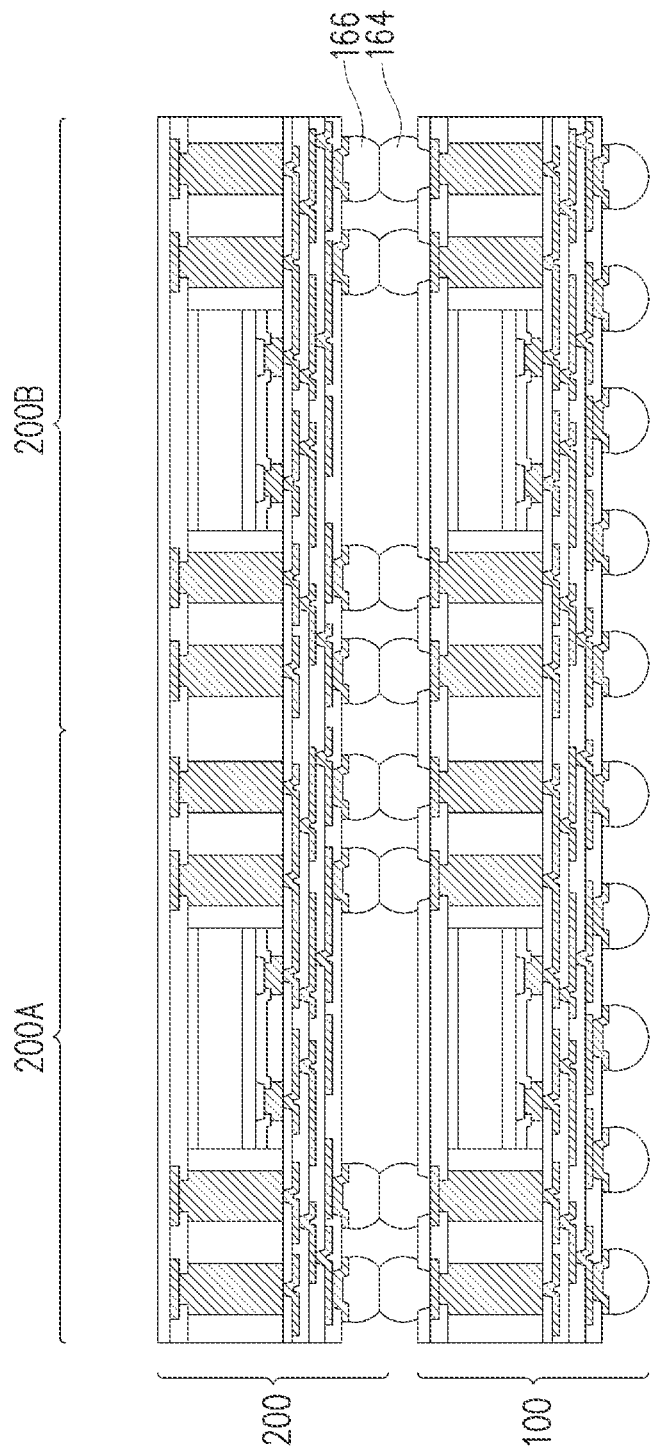

In FIG. 12, the second package component 200 is aligned with the first package component 100. Respective package regions of each of the package components 100 and 200 are aligned. For example, the first package regions 100A and 200A are aligned, and the second package regions 100B and 200B are aligned. The package components 100 and 200 are pressed together such that the conductive connectors 166 of the second package component 200 contact the conductive connectors 164 of the first package component 100.

Figures 13C, 13D:
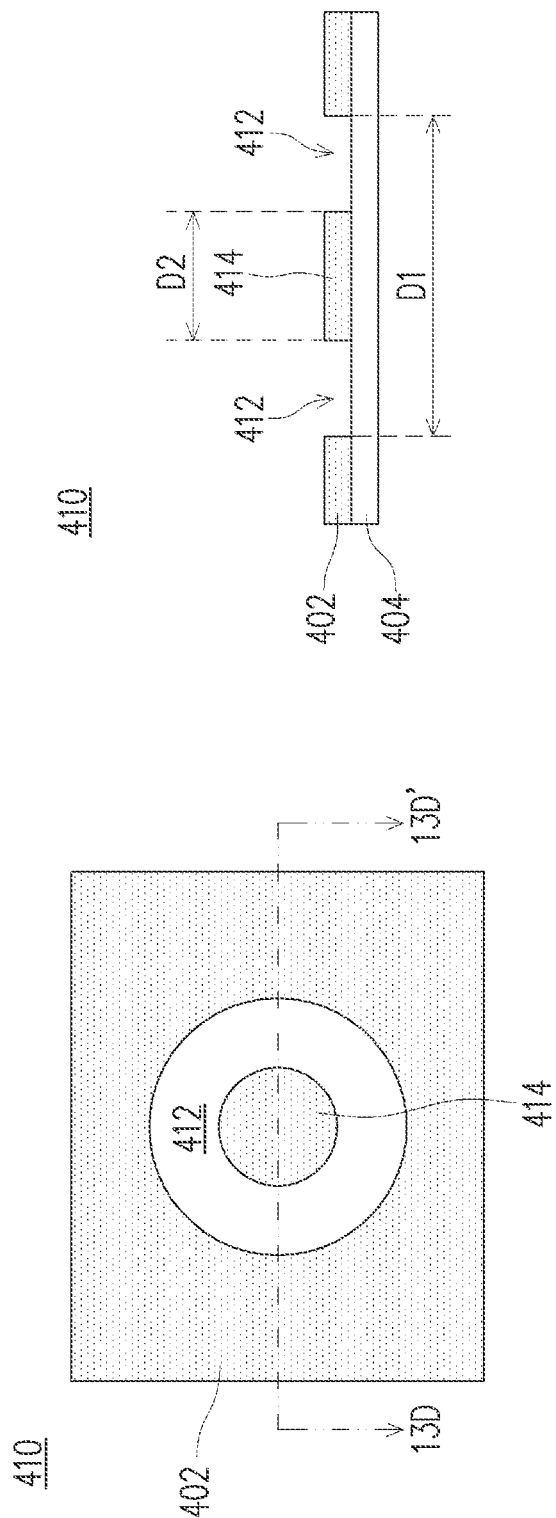

FIGS. 13A through 13J illustrate a masking apparatus 400 that may be used to shape laser shot profiles in subsequent reflow processes. FIG. 13A illustrates a top view of the masking apparatus, showing a masking layer 402 with openings such as an annular opening 412, a round opening 422, and rectangular openings 432 that expose a mounting layer 404. The masking layer 402 comprises a material opaque to laser light such as e.g. a metal such as aluminum, copper, iron, lead, ceramics, the like, or a combination thereof. In some embodiments, the masking apparatus has a length in an x direction in a range of about 50 mm to about 400 mm, and a width in a y direction in a range of about 50 mm to about 400 mm. The top view of the masking layer 402 illustrates an example embodiment of an arrangement of openings through the masking layer 402. It should be understood that the embodiment apparatus shown in top view in FIG. 13A is merely an example of many possible embodiment apparatuses. One of ordinary skill in the art would recognize many variations, alternatives, and modifications. For example, various openings through the masking layer 402 as illustrated in FIG. 13A may be added, removed, replaced, rearranged and repeated.

The mounting layer 404 comprises a material transparent to laser light by 90% or greater such as e.g. glass, plexiglass, sapphire, the like, or a combination thereof. The masking layer 402 may be attached to the mounting layer 404 by mechanical fasteners such as e.g. screws, however any suitable method of securing the masking layer 402 to the mounting layer 404 may be used. The mounting layer 404 allows portions of the masking layer 402, such as e.g. round portion 414, to rest on the mounting layer 404 and be separated from the rest of the masking layer 402 without direct connections across openings in the masking layer 402. In some embodiments the mounting layer may have an index of refraction in a range of about 1.3 to about 1.8, which may be useful for scattering laser light to achieve broader heating profiles.

FIG. 13B illustrates a cross-sectional view of the masking apparatus 400 through the cross-section 13B-13B' as shown in FIG. 13A. As shown in FIG. 13B, the opaque masking layer 402 is over the transparent mounting layer 404. In some embodiments, the masking layer 402 has a thickness T1 in a range of about 100 nm to about 3 mm and the mounting layer 404 has a thickness T2 in a range of about 0.5 mm to about 3 mm.

FIG. 13C illustrates a detailed view of region 410 as illustrated in FIG. 13A. An annular opening 412 extends through the masking layer 402 to expose an annular region of the mounting layer 404. The annular opening 412 may be used to shape the profile of subsequent laser shots (see FIG. 15 below). A round portion 414 of the masking layer 402 is centered in the annular opening 412 without connecting the remainder of the masking layer 402. The round portion 414 may be secured to the underlying mounting layer 404 by a suitable mechanical fastener such as e.g. a screw, however any suitable method of securing the round portion 414 to the mounting layer 404 may be used.

FIG. 13D illustrates a cross-sectional view of region 410 through the cross-section 13D-13D' as shown in FIG. 13C. As shown in FIG. 13D, in some embodiments, the annular opening 412 has a diameter D1 in a range of about 10 mm to about 60 mm, which may be advantageous for achieving laser assisted bonding (LAB) between the conductive connectors 164 of the first package component 100 and the conductive connectors 166 of the second package component 200 without causing significant warpage of the first package component 100 and the second package component 200. The diameter D1 being larger than about 60 mm may be disadvantageous by allowing a larger amount of laser energy to heat the package components 100 and 200, which may produce undesirable warpage of the package components 100 and 200. The diameter D1 being smaller than about 10 mm may be disadvantageous because the smaller amounts of laser energy allowed to heat the package components 100 and 200 may not produce a desired bonding strength.

In some embodiments, the round portion 414 has a diameter D2 in a range of about 4 mm to about 30 mm, which may be advantageous for achieving laser assisted bonding (LAB) between the conductive connectors 164 of the first package component 100 and the conductive connectors 166 of the second package component 200 without causing significant warpage of the first package component 100 and the second package component 200. The diameter D2 being smaller than about 4 mm may be disadvantageous by allowing a larger amount of laser energy to heat the package components 100 and 200, which may produce undesirable warpage of the package components 100 and 200. The diameter D2 being larger than about 30 mm may be disadvantageous because the smaller amounts of laser energy allowed to heat the package components 100 and 200 may not produce a desired bonding strength.

FIG. 13E illustrates a detailed view of region 420 as illustrated in FIG. 13A. A round opening 422 extends through the masking layer 402 to expose a round region of the mounting layer 404. The round opening 422 may be used to shape the profile of subsequent laser shots (see FIG. 14 below). In this embodiment, however, the round opening 422 is present without the presence of the round portion 414.

FIG. 13F illustrates a cross-sectional view of region 420 through the cross-section 13F-13F' as shown in FIG. 13E. As shown in FIG. 13F, in some embodiments, the round opening 422 has a diameter D3 in a range of about 4 mm to about 60 mm, which may be advantageous for achieving laser assisted bonding (LAB) between the conductive connectors 164 of the first package component 100 and the conductive connectors 166 of the second package component 200 without causing significant warpage of the first package component 100 and the second package component 200. The diameter D3 being larger than about 60 mm may be disadvantageous by allowing a larger amount of laser energy to heat the package components 100 and 200, which may produce undesirable warpage of the package components 100 and 200. The diameter D3 being smaller than about 4 mm may be disadvantageous because the smaller amounts of laser energy allowed to heat the package components 100 and 200 may not produce a desired bonding strength.

Figures 13G, 13H:
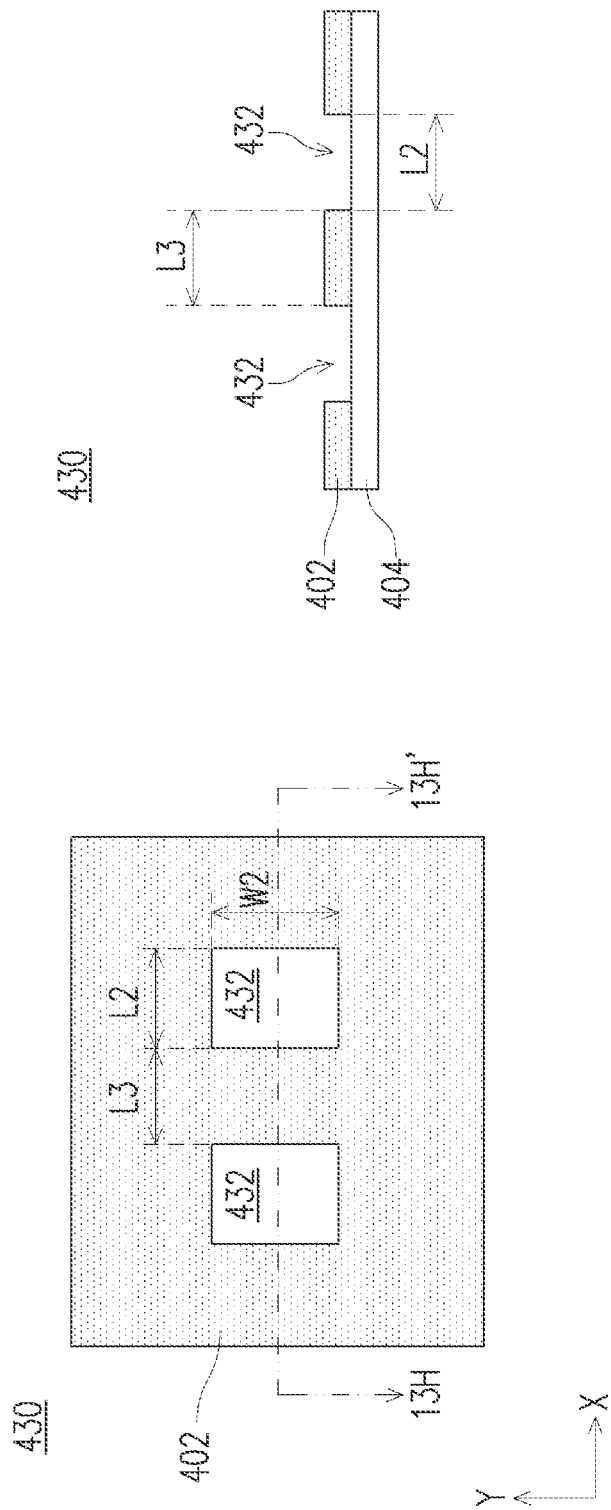

FIG. 13G illustrates a detailed view of region 430 as illustrated in FIG. 13A. At least two rectangular openings 432 extend through the masking layer 402 to expose rectangular regions of the mounting layer 404.

FIG. 13H illustrates a cross-sectional view of region 430 through the cross-section 13H-13H' as shown in FIG. 13G. As shown in FIG. 13H, in some embodiments, the rectangular openings 432 have a length L2 in the x direction in a range of about 10 mm to about 40 mm and a width W2 in the y direction in a range of about 15 mm to about 40 mm. The length L2 being in a range of about 10 mm to about 40 mm may be advantageous for achieving laser assisted bonding (LAB) between the conductive connectors 164 of the first package component 100 and the conductive connectors 166 of the second package component 200 without causing significant warpage of the first package component 100 and the second package component 200. The length L2 being larger than about 40 mm may be disadvantageous by allowing a larger amount of laser energy to heat the package components 100 and 200, which may produce undesirable warpage of the package components 100 and 200. The length L2 being smaller than about 10 mm may be disadvantageous because the smaller amounts of laser energy allowed to heat the package components 100 and 200 may not produce a desired bonding strength.

The width W2 being in a range of about 15 mm to about 40 mm may be advantageous for achieving laser assisted bonding (LAB) between the conductive connectors 164 of the first package component 100 and the conductive connectors 166 of the second package component 200 without causing significant warpage of the first package component 100 and the second package component 200. The width W2 being larger than about 40 mm may be disadvantageous by allowing a larger amount of laser energy to heat the package components 100 and 200, which may produce undesirable warpage of the package components 100 and 200. The width W2 being smaller than about 15 mm may be disadvantageous because the smaller amounts of laser energy allowed to heat the package components 100 and 200 may not produce a desired bonding strength.

The rectangular openings 432 may be separated by a separation length L3 in the x direction in a range of about 5 mm to about 40 mm. The separation length L3 being in a range of about 5 mm to about 40 mm may be advantageous for achieving laser assisted bonding (LAB) between the conductive connectors 164 of the first package component 100 and the conductive connectors 166 of the second package component 200 without causing significant warpage of the first package component 100 and the second package component 200. The separation length L3 being larger than about 40 mm may be disadvantageous by not allowing the heating and reflowing of a sufficient number the conductive connectors 164 and 166, reducing throughput. The separation length L3 being smaller than about 5 mm may be disadvantageous allowing a larger amount of laser energy to heat the package components 100 and 200, which may produce undesirable warpage of the package components 100 and 200.

Figures 13I, 13J:
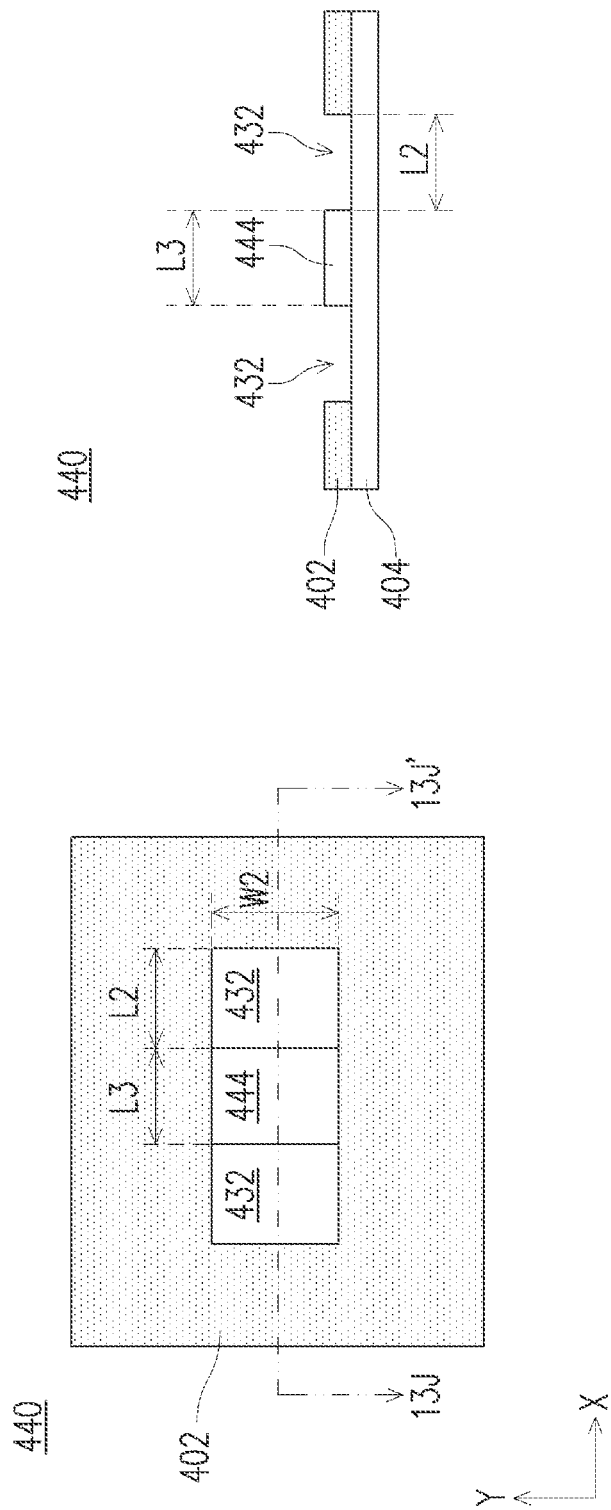

FIG. 13I illustrates a detailed view of region 440 as illustrated in FIG. 13A. The region 440 comprises rectangular openings 432 with substantially similar lengths L2, widths W2, and a separation length L3 as shown above with respect to FIG. 13G. However, in this embodiment the rectangular openings 432 are separated by a partially transparent portion 444 located between the rectangular openings 432.

FIG. 13J illustrates a cross-sectional view of region 440 through the cross-section 13J-13J' as shown in FIG. 13I. As illustrated, the partially transparent portion 444 is located between adjacent rectangular openings 432 with a length L3 and a width W2. The partially transparent portion 444 comprises polyimide (PI), silicon, thin metal film, other suitable optical films, the like, or a combination thereof. The rectangular openings 432 and partially transparent portion 444 may be used to shape the profile of subsequent laser shots (see FIG. 16 below).

However, while the transparent portion 444 and the rectangular openings 432 are illustrated as being rectangular in FIG. 13I, this is intended to be illustrative and is not intended to be limiting to the embodiments. For example, in other embodiments (not illustrated), the partially transparent portion 444 may have a round profile substantially similar to the round portion 414 illustrated in FIG. 13C. In such an embodiment, the round partially transparent portion may be mounted on the mounting layer 404 and be surrounded by a round opening substantially similar to the round opening 412 without any opaque portion of the masking layer 404 directly contacting it. Any suitable shape may be utilized.

The partially transparent portion 444 is transparent to laser light in a range of about 10% to about 60%, which may be advantageous for achieving laser assisted bonding (LAB) between the conductive connectors 164 of the first package component 100 and the conductive connectors 166 of the second package component 200 without causing significant warpage of the first package component 100 and the second package component 200. The partially transparent portion 444 being less than 10% transparent to laser light may be disadvantageous because the smaller amounts of laser energy allowed through the partially transparent portion 44 to heat the package components 100 and 200 may not produce a desired bonding strength. The partially transparent portion 444 being more than 60% transparent to laser light may be disadvantageous by allowing a larger amount of laser energy to heat the package components 100 and 200, which may produce undesirable warpage of the package components 100 and 200.

FIGS. 14A through 15B illustrate an embodiment of a first reflow process, which includes a plurality of laser shots and hence a plurality of reflow processes. The reflow process shown in FIGS. 14A through 15B is thus referred to as a multi-shot reflow process. The plurality of laser shots are performed using a laser beam 52, which is generated by a laser beam generator 54. In each of the laser shots, the laser beam 52 is projected on one region of the top surface of the second package component 200, so that heat is absorbed by the second package component 200 and conducted through the second package component 200 to the conductive connectors 164 and 166, causing the reflow of the conductive connectors 164 and 166 to form conductive connectors 168. The laser beam generator 54 is configured to generate the laser beam 52, and the laser beam 52 is emitted out of an emitter of the laser beam generator 54. The laser beam 52 is larger than a typical laser beam. For example, the laser beam 52 may have a size in the range of from about 3×3 $mm^2$ to about 100×100 $mm^2$. For example, the laser beam generator 54 is configured to enlarge a small laser beam to a desirable larger size. The power of different portions of the laser beam 52 is substantially uniform, for example, with a variation smaller than about 10 percent throughout the rectangular region. In each of the laser shots, the conductive connectors 164 and 166 covered by the laser beam 52 are reflowed substantially simultaneously.

Figure 14A:
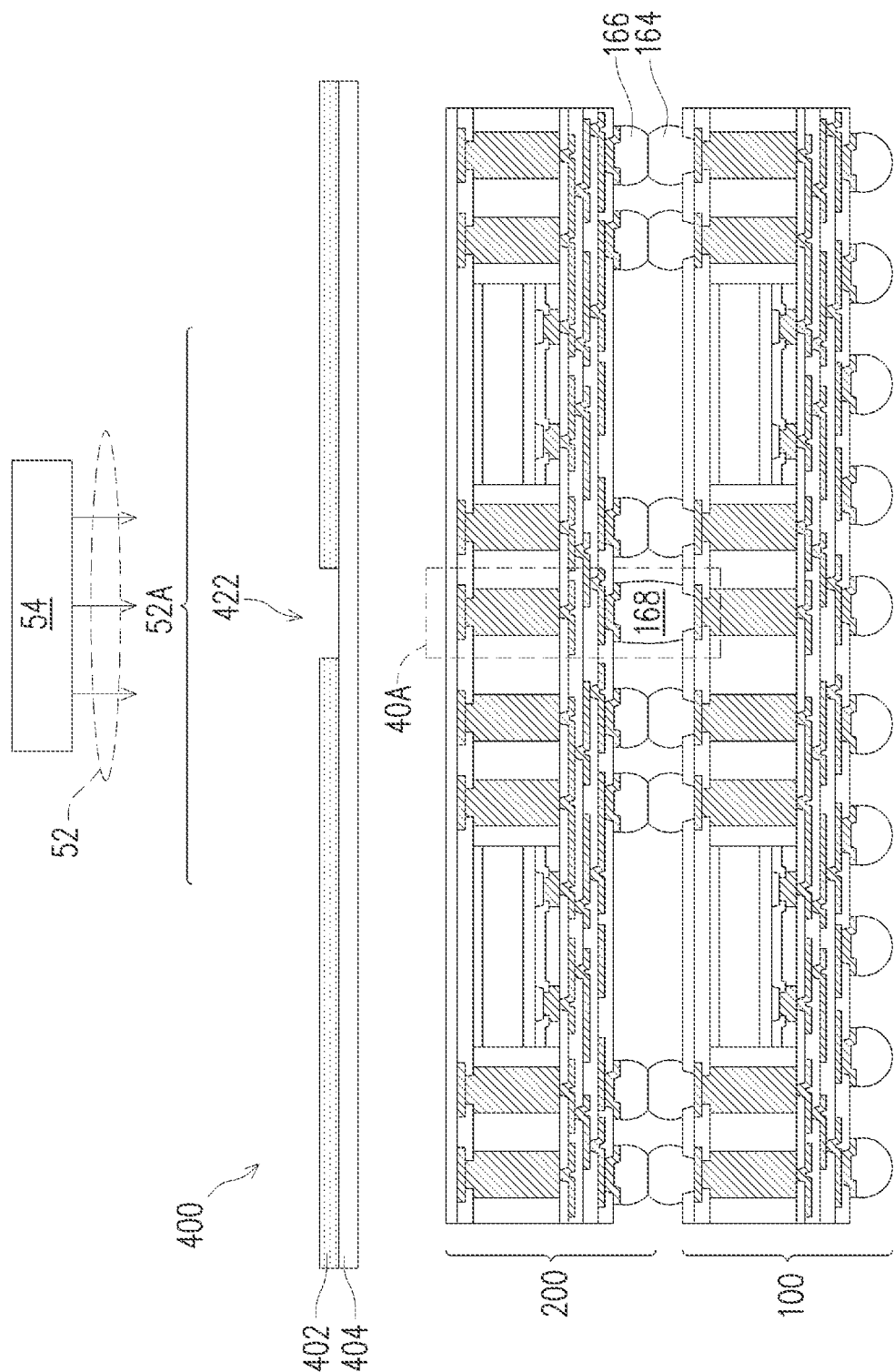

In FIG. 14A, the masking apparatus 400 is positioned between the laser beam generator 54 and the second package component 200 to expose a first region 40A of the second package component 200. A first laser shot 52A is then performed through the round opening 422 on the first region 40A. FIG. 14B illustrates a top view of the second package component 200 showing the first region 40A. The first region 40A includes components of the package components 100 and 200 which are directly in the projecting path of the first laser shot 52A. When the laser beam 52 is projected on the first region 40A of the second package component 200, the first region 40A is heated, and the heat is transferred to the conductive connectors 164 and 166 directly under the first region 40A. The first laser shot 52A is performed until the conductive connectors 164 and 166 in the first region 40A are molten and reflowed to form conductive connectors 168. Although the first region 40A is shown with a single conductive connector 168 for simplicity of illustration, in some embodiments the first region 40A includes multiple conductive connectors 168. The conductive connectors 164 and 166 outside of the first region 40A (e.g., not in the projecting path of laser beam 52) are heated less than the conductive connectors 164 and 166 inside of the first region 40A, and are not reflowed.

The duration and the unit power (e.g., the power per unit area) of the first laser shot 52A is controlled such that a majority of the conductive connectors 164 and 166 outside of the first region 40A are not molten and hence are not reflowed. Accordingly, the duration of the first laser shot 52A is long enough to melt the conductive connectors 164 and 166 inside of the first region 40A, and short enough so that at least the majority of (or all of) of the conductive connectors 164 and 166 outside of the first region 40A are not molten. A small number of conductive connectors 164 and 166 that are outside of and close to the first region 40A may also be molten, for example, due to process variations or increased process margins. The unit power of the laser beam 52 is also selected to be high enough to melt the conductive connectors 164 and 166 inside of the first region 40A, and low enough so that the conductive connectors 164 and 166 outside of the first region 40A are not molten. In some embodiments, the duration of the laser shot is in the range of from about 2 seconds to about 30 seconds. The unit power may be in the range of about 0.1 watts/mm$^2$ to about 3 watts/mm$^2$. It should be appreciated that the length of time and unit power needed to melt the conductive connectors 164 and 166 is affected by a plurality of factors, which factors may include the unit power, the shot duration, the thickness of the second package component 200, the materials and the thermal conductivity of the second package component 200, and the like. In some embodiments, the conductive connectors 164 and 166 have a melting temperature higher than about 200° C., and may be in the range of about 215° C. to about 230° C. The unit power of the laser shot may be adjusted to obtain a particular heating rate and peak temperature. In an embodiment, the peak temperature is in a range of from about 240° C. to about 300° C., and the heating rate is in a range of from about 10° C./second to about 400° C./second. After the conductive connectors 164 and 166 inside the first region 40A are molten, and before the conductive connectors 164 and 166 outside the first region 40A are molten, the first laser shot is ended.

After the first laser shot 52A, the laser beam 52 is turned off, and is stopped from being projected on the second package component 200. Between the ending time of the first laser shot 52A and the starting time of a second laser shot 52B (see FIG. 15A), a delay time may be implemented. During the delay, no laser shots are performed. The delay is long enough so that the reflowed conductive connectors 168 cool down and solidify. For example, the temperature of the conductive connectors 168 may drop into the range of about 100° C. to about 150° C. after the delay time. The delay time may be in the range of from about 5 seconds to about 30 seconds. In some embodiments, cooling of the conductive connectors 168 is performed, such as air cooling. In such embodiments, the delay time may be adjusted to obtain a particular cooling rate. In some embodiments, the delay time is a predetermined period of time. In an embodiment, the cooling rate is greater than about 5° C./second.

Figure 15A:
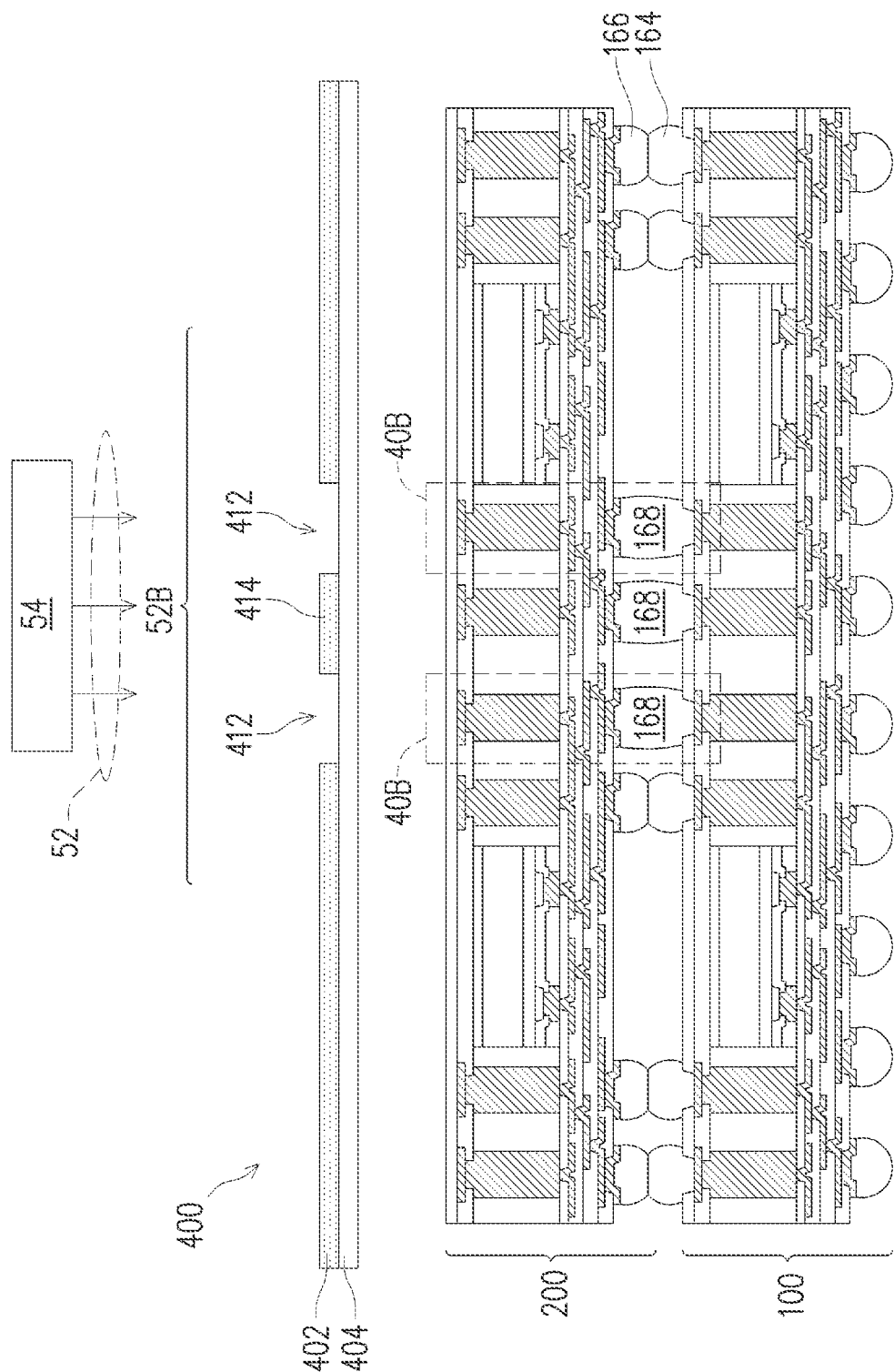
Figure 15B:
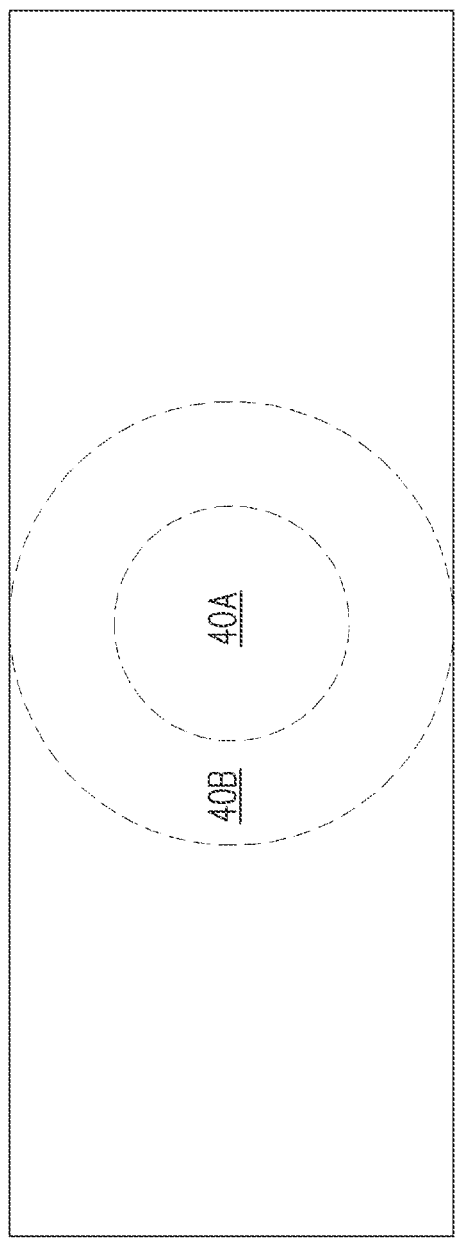

In FIG. 15A, the masking apparatus 400 is positioned between the laser beam generator 54 and the second package component 200 to expose a second region 40B of the second package component 200 through the annular opening 412. A second laser shot 52B is then performed at a second region 40B of the second package component 200. FIG. 15B illustrates a top view of the second package component 200 showing the second region 40B around the first region 40A. The second region 40B includes components of the package components 100 and 200 which are directly in the projecting path of the second laser shot 52B. As a result, the conductive connectors 164 and 166 in the second region 40B are reflowed. Most or all of the conductive connectors 164 and 166 outside of the second region 40B do not receive adequate heat, and are not molten and not reflowed. A small number of conductive connectors 164 and 166 that are outside of and close to the second region 40B may also be molten, for example, due to process variations or increased process margins. Although the second region 40B is shown with two conductive connectors 168 for simplicity of illustration, in some embodiments the second region 40B includes more than two conductive connectors 168.

The moveable masking apparatus 400 allows for a greater number of laser shot shapes and heating profiles by repositioning of the masking apparatus 400 between the laser beam generator 54 and the second package component 200. This may allow the reflowing of the conductive connectors 168 with a smaller number of laser shots, leading to higher efficiency of process and greater throughput. In some embodiments, multiple first laser shots 52A and/or second laser shots 52B are performed at the same time through multiple round openings 422 and annular openings 412. The transparent mounting layer 404 allows portions of the masking layer 402, such as e.g. round portion 414 (see above, FIG. 13C), to rest on the mounting layer 404 and be separated from the rest of the masking layer 402 without direct connections across openings in the masking layer 402. This may be useful for achieving laser assisted bonding (LAB) between the conductive connectors 164 of the first package component 100 and the conductive connectors 166 of the second package component 200 without causing significant warpage of the first package component 100 and the second package component 200.

In some embodiments, the order of the first laser shot 52A and the second laser shot 52B are reversed. The laser beam 52 may first pass through the annular opening 412 first to reflow the conductive connectors 164 and 166 in the second region 40B. Following this, the mask 400 is repositioned so that the laser beam 52 may then pass through the round opening 422 to reflow the conductive connectors 164 and 166 in the first region 40A. In these embodiments, the conductive connectors 164 and 166 in the second region 40B are reflowed before the conductive connectors 164 and 166 in the first region 40A.

Figure 16:
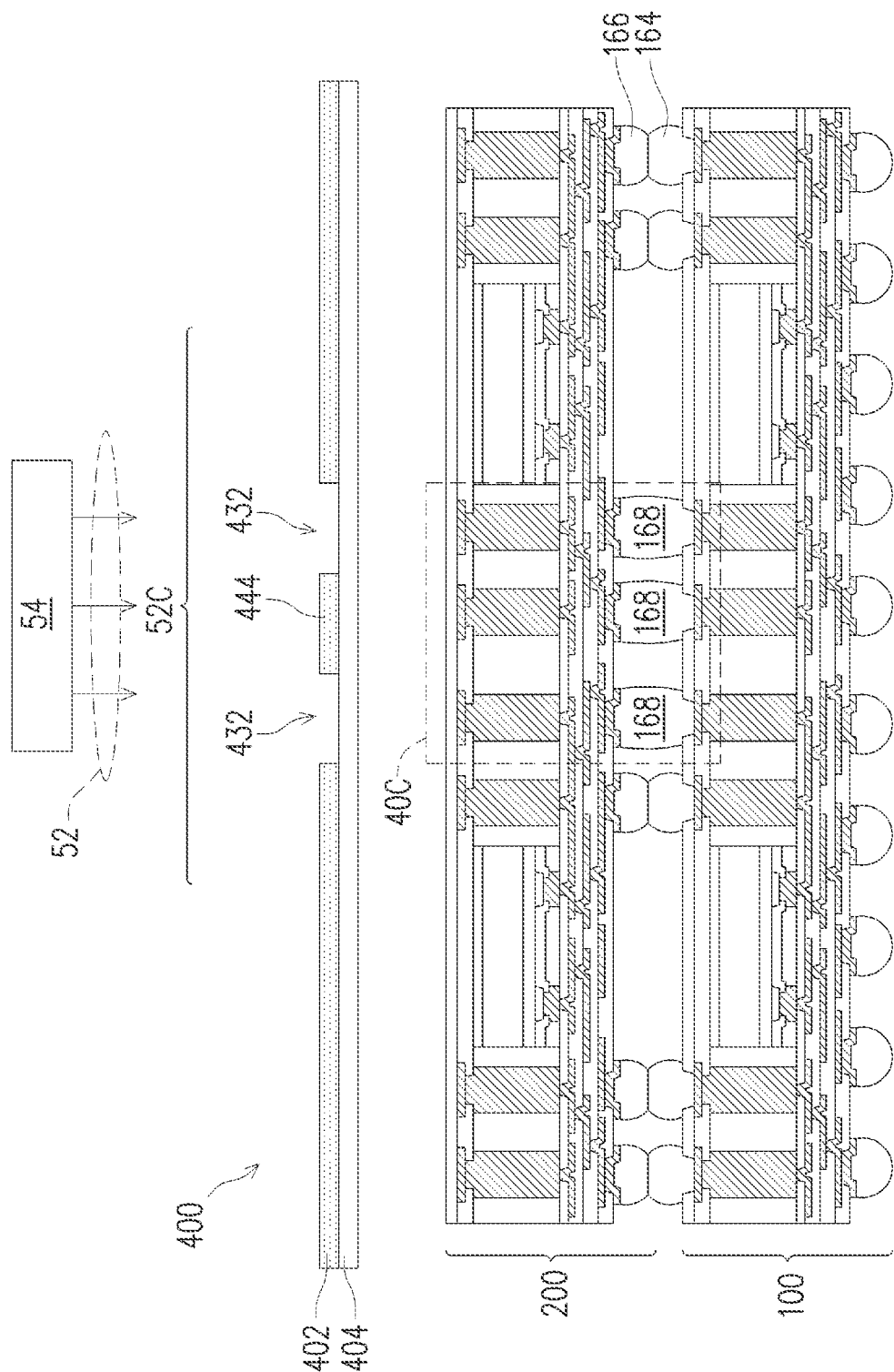

FIG. 16 illustrates an embodiment of a second reflow process, which may be performed alternatively to or sequentially with the first reflow process as described above with respect to FIGS. 14A through 15B. The second reflow process includes a plurality of laser shots and hence a plurality of reflow processes, and so is also referred to as a multi-shot reflow process. The plurality of laser shots 52C may be performed using a substantially similar laser beam 52 and laser beam generator 54 as described above with respect to FIG. 14A.

In FIG. 16, the masking apparatus 400 is positioned between the laser beam generator 54 and the second package component 200 to expose a third region 40C of the second package component 200. A third laser shot 52C is then performed through the rectangular openings 432 and through the partially transparent portion 444 on the third region 40C. The third region 40C includes components of the package components 100 and 200 which are directly in the projecting path of the third laser shot 52C. When the laser beam 52 is projected on the third region 40C of the second package component 200, the third region 40C is heated, and the heat is transferred to the conductive connectors 164 and 166 directly under the third region 40C. The third laser shot 52C is performed until the conductive connectors 164 and 166 in the third region 40C are molten and reflowed to form conductive connectors 168. Although the third region 40C is shown with three conductive connectors 168 for simplicity of illustration, in some embodiments the third region 40C includes a different number of conductive connectors 168, such as more than three conductive connectors 168. The conductive connectors 164 and 166 outside of the third region 40C (e.g., not in the projecting path of laser beam 52) are heated less than the conductive connectors 164 and 166 inside of the third region 40C, and are not reflowed.

By passing the third laser shot 52C through the partially transparent portion 444 in addition to the rectangular openings 432, the conductive connectors 164 and 166 inside of the third region 40C may be sufficiently heated to be reflowed without excessively heating the package components 100 and 200 and producing undesirable warpage. Using the partially transparent portion 444 to shape the third laser shot 52C may allow for a larger third region 40C to be heated using one third laser shot 52C without excessive heating leading to warpage. The conductive connectors 164 and 166 in the path of the portion of the third laser shot 52C passing through the partially transparent portion 444 may be sufficiently heated to be reflowed into conductive connectors 168 without requiring a subsequent laser shot passing directly through rectangular openings 432 to heat the conductive connectors 164 and 166. In some embodiments, multiple third laser shots 52C are performed at the same time through multiple rectangular openings 432 and partially transparent portions 444. In some embodiments, multiple third laser shots 52C are performed sequentially through rectangular openings 432 and partially transparent portions 444.

Figure 17:
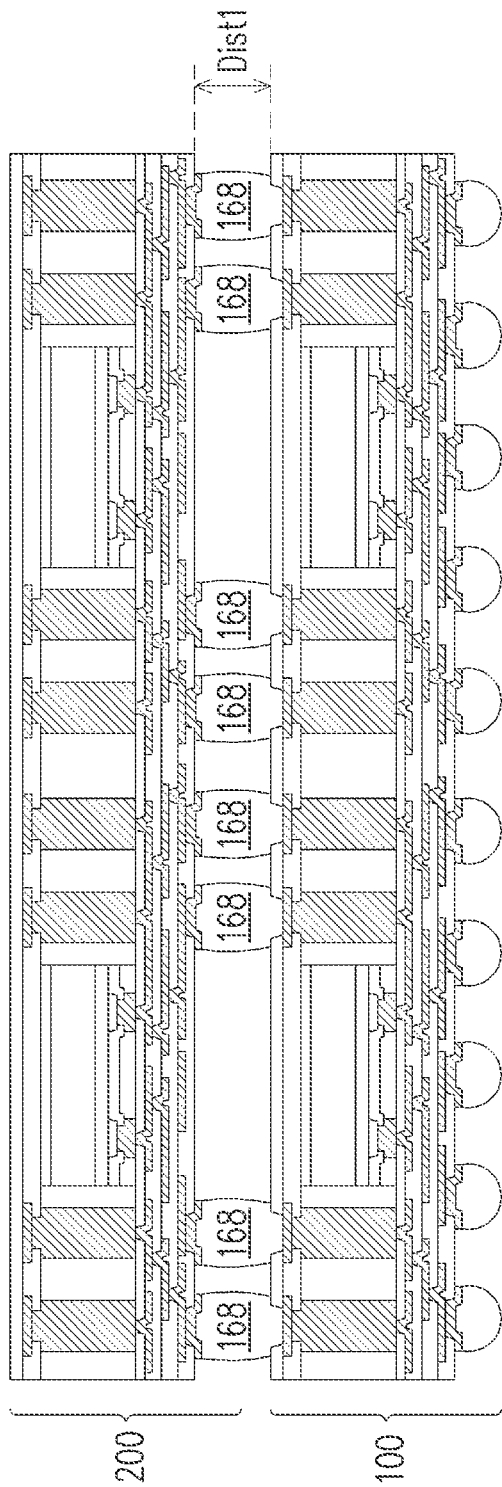

FIG. 17 illustrates the package components 100 and 200 bonded by conductive connectors 168 after the first reflow process as shown above in FIGS. 14A through 15B, the second reflow process as shown above in FIG. 16, or a combination thereof are performed to reflow all of the conductive connectors 164 and 166 and produce reflowed conductive connectors 168. The multi-shot reflow process results in the local heating of the second package component 200 in each of the shots, rather than globally heating the entirety of both package components 100 and 200 at the same time. When a laser shot is performed after a preceding shot has ended, the increased temperature caused by the preceding laser shots has already been reduced. Heating the package components 100 and 200 causes wafer warpage, and the magnitude of the warpage is related to the heating temperature. By performing more localized heating, the overall heating temperature may be reduced, and warpage of the package components 100 and 200 may be reduced. In addition, the laser shots 52A and 52B are projected on the second package component 200, and the first package component 100 receives a very small dose (if any) of the laser beam directly. Accordingly, the first package component 100 is not heated significantly, and the corresponding warpage is reduced.

Although the conductive connectors 168 are shown as connecting the metallization pattern 110 and UBMs 160, it should be appreciated that the conductive connectors 168 may be used to connect to any conductive features of the package components 100 and 200. For example, the conductive connectors 168 may also physically connect to the through vias 116, such as in embodiments where the backside redistribution structure 106 is omitted. Likewise, the conductive connectors 168 may physically connect to the metallization pattern 156, such as in embodiments where the UBMs 160 are omitted.

Because the multi-shot reflow process reduces or avoids wafer warpage, the overall distance Dist1 between the package components 100 and 200 may be more consistent across the different package regions. For example, the distance Dist1 at edges of the package components 100 and 200 may be less than the distance Dist1 at centers of the package components 100 and 200. Further, the distance Dist1 may vary by less than 5% across the diameter of the package components 100 and 200.

After the multi-shot reflow process is completed, the package components 100 and 200 may be cleaned in a cleaning process. The cleaning process may be, e.g., a flux clean, which help remove residual material. The flux clean may be performed by flushing, rinsing, or soaking using hot water or a cleaning solvent. Further, an underfill or encapsulant may optionally be injected between the package components 100 and 200, to surround the conductive connectors 168.

Figure 18:
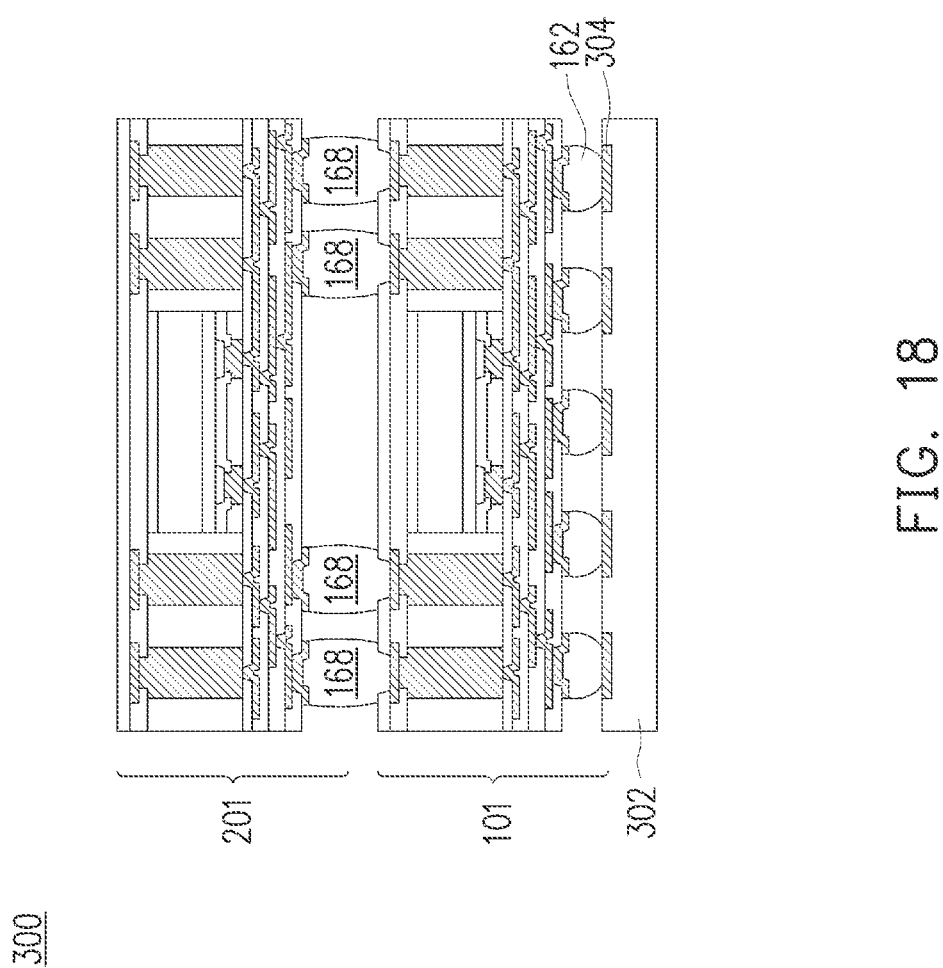

FIG. 18 illustrates a cross-sectional view of intermediate steps during a process for forming a package structure 300, in accordance with some embodiments. The package structure 300 may be referred to a package-on-package (PoP) structure.

A singulation process is performed by sawing along scribe line regions, e.g., between the package regions of the package components 100 and 200. The sawing singulates the adjacent package regions 100A, 100B, 200A, and 200B from the package components 100 and 200. The resulting singulated first packages 101 are from one of the first package region 100A or the second package region 100B, and the resulting singulated second packages 201 are from one of the first package region 200A or the second package region 200B.

The packages 101 and 201 are then mounted to a package substrate 302 using the conductive connectors 162. The package substrate 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 302 may be a SOI substrate. Generally, an SOI substrate includes a layer of a semiconductor material such as epitaxial silicon, germanium, silicon germanium, SOI, SGOI, or combinations thereof. The package substrate 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 302.

The package substrate 302 may include active and passive devices (not shown). As one of ordinary skill in the art will recognize, a wide variety of devices such as transistors, capacitors, resistors, combinations of these, and the like may be used to generate the structural and functional requirements of the design for the package structure 300. The devices may be formed using any suitable methods.

The package substrate 302 may also include metallization layers and vias (not shown) and bond pads 304 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 302 is substantially free of active and passive devices.

In some embodiments, the conductive connectors 162 are reflowed to attach the first package 101 to the bond pads 304. The conductive connectors 162 electrically and/or physically couple the package substrate 302, including metallization layers in the package substrate 302, to the first package 101. In some embodiments, passive devices (e.g., surface mount devices (SMDs), not illustrated) may be attached to the first package 101 (e.g., bonded to the bond pads 304) prior to mounting on the package substrate 302. In such embodiments, the passive devices may be bonded to a same surface of the first package 101 as the conductive connectors 162.

The conductive connectors 162 may have an epoxy flux (not shown) formed thereon before they are reflowed with at least some of the epoxy portion of the epoxy flux remaining after the first package 101 is attached to the package substrate 302. This remaining epoxy portion may act as an underfill to reduce stress and protect the joints resulting from the reflowing the conductive connectors 162. In some embodiments, an underfill (not shown) may be formed between the first package 101 and the package substrate 302 and surrounding the conductive connectors 162. The underfill may be formed by a capillary flow process after the first package 101 is attached or may be formed by a suitable deposition method before the first package 101 is attached.

Embodiments may achieve advantages. By performing laser assisted bonding (LAB) with a multi-layer masking apparatus, the warpage of the package components 100 and 200 may be reduced. More flexibility may be afforded during manufacturing by selectively heating areas of the package components 100 and 200 with different types of laser beam shapes and heating profiles. Manufacturing throughput may also be increased through the faster heating afforded by laser heating with varied laser beam profiles that may be configured by moving the position of the masking apparatus.

In accordance with an embodiment, a masking apparatus for performing a laser heating process includes: a masking layer, the masking layer including a plurality of masking portions, the masking portions being opaque to a reflow laser; and a mounting layer, the masking layer being on the mounting layer, the mounting layer being transparent to the reflow laser. In an embodiment, a first masking portion of the plurality of masking portions includes a round profile. In an embodiment, a second masking portion of the plurality of masking portions includes a round profile, the second masking portion surrounding the first masking portion, wherein the first masking portion does not contact any other portion of the masking layer. In an embodiment, the second masking portion is in an opening in the first masking portion, the opening having a diameter in a range of 10 mm to 60 mm, and the second masking portion having a diameter in a range of 4 mm to 30 mm. In an embodiment, at least one gap within the masking layer has a rectangular profile. In an embodiment, the masking layer includes a partially transparent portion. In an embodiment, the mounting layer includes glass. In an embodiment, the masking layer is attached to the mounting layer by screws.

In accordance with another embodiment, a method for bonding semiconductor substrates includes: placing a die on a substrate, respective first connectors of a plurality of first connectors on the die contacting respective second connectors of a plurality of second connectors on the substrate; and performing a heating process on the die and the substrate to bond the respective first connectors with the respective second connectors, the heating process including: placing a mask between a laser generator and the substrate, the mask including a masking layer and a transparent layer, portions of the masking layer being opaque; and performing a first laser shot, the laser passing through a first gap in the masking layer and passing through the transparent layer to heat a first portion of a top side of the die opposite the substrate. In an embodiment, the first gap has an annular profile. In an embodiment, the method further includes performing a second laser shot, wherein during the second laser shot the laser passes through a second gap in the masking layer to heat a second portion of the top side of the die, the second portion of the top side of the die being surrounded by the first portion of the top side of the die. In an embodiment, the method further includes moving the masking layer relative to the substrate after the performing the first laser shot and prior to performing the second laser shot. In an embodiment, the second gap has an external round profile and an internal round profile. In an embodiment, the method further includes performing a plurality of the heating processes, the plurality of the heating processes bonding each first connector of the plurality of first connectors with a respective second connector of the plurality of second connectors.

In accordance with yet another embodiment, a method of forming a semiconductor device includes: aligning a first package component with a second package component, the first package component having a first conductive connector, the second package component having a second conductive connector, wherein the aligning brings the first conductive connector into physical contact with the second conductive connector; performing a first laser shot, the first laser shot impacting the first package component opposite the first conductive connector, the first laser shot being shaped by passing through a first opening in a masking layer and through a first partially transparent portion of the masking layer adjacent to the first opening, the first laser shot reflowing the first conductive connector and the second conductive connector. In an embodiment, the first laser shot being shaped further includes the first laser shot passing through a second opening in the masking layer. In an embodiment, the method further includes performing a second laser shot, the second laser shot impacting the first package component opposite a third conductive connector, the third conductive connector being in physical contact with a fourth conductive connector on the second package component. In an embodiment, the second laser shot is shaped by passing through a third opening in a masking layer, through a fourth opening in the masking layer, and through a second partially transparent portion of the masking layer between the third opening and the fourth opening. In an embodiment, the first laser shot and the second laser shot are performed simultaneously. In an embodiment, the first partially transparent portion is transparent to laser light in a range of 10% to 60%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for bonding semiconductor substrates, the method comprising:
    placing a die on a substrate, respective first connectors of a plurality of first connectors on the die contacting respective second connectors of a plurality of second connectors on the substrate; and
    performing a heating process on the die and the substrate to bond the respective first connectors with the respective second connectors, the heating process comprising:
        placing a mask between a laser generator and the substrate, the mask comprising a masking layer and a transparent layer, portions of the masking layer being opaque;
        performing a first laser shot, the laser passing through a first gap in the masking layer and passing through the transparent layer to heat a first portion of a top side of the die opposite the substrate; and
        performing a second laser shot after performing the first laser shot, wherein during the second laser shot the laser passes through a second gap in the masking layer to heat a second portion of the top side of the die, the second portion of the top side of the die being surrounded by the first portion of the top side of the die, the first gap being outside an outer boundary of the second gap and the second gap being outside an outer boundary of the first gap.

2. The method of claim 1, wherein the first gap has an annular profile.

3. The method of claim 1, further comprising moving the masking layer relative to the substrate after the performing the first laser shot and prior to performing the second laser shot.

4. The method of claim 1, wherein the second gap has an external round profile and an internal round profile.

5. The method of claim 1, wherein the second laser shot is performed after a connector reflowed by the first laser shot has solidified.

6. The method of claim 1, wherein the mask is moved between performing the first laser shot and performing the second laser shot.

7. A method of forming a semiconductor device, the method comprising:
    aligning a first package component with a second package component, the first package component having a first conductive connector, the second package component having a second conductive connector, wherein the aligning brings the first conductive connector into physical contact with the second conductive connector;
    performing a first laser shot, the first laser shot impacting a first region of the first package component opposite the first conductive connector, the first laser shot being shaped by passing through a first opening in a masking layer and through a first partially transparent portion of the masking layer adjacent to the first opening, the first laser shot reflowing the first conductive connector and the second conductive connector; and
    performing a second laser shot at least 5 seconds after performing the first laser shot, the second laser shot impacting a second region of the first package component, the second region surrounding the first region, the second laser shot being shaped by passing through a second opening in the masking layer.

8. The method of claim 7, wherein the first laser shot being shaped further comprises the first laser shot passing through a third opening in the masking layer.

9. The method of claim 7, wherein the second laser shot impacts the first package component opposite a third conductive connector, the third conductive connector being in physical contact with a fourth conductive connector on the second package component.

10. The method of claim 9, wherein the second laser shot is further shaped by passing through a third opening in the masking layer and through a second partially transparent portion of the masking layer between the second opening and the third opening.

11. The method of claim 7, wherein the first partially transparent portion is transparent to laser light in a range of 10% to 60%.

12. The method of claim 7, wherein a unit power of the first laser shot is in a range of 0.1 watts/mm$^2$ to 3 watts/mm$^2$.

13. A method of forming a semiconductor device, the method comprising:
    placing a mask over a first side of a substrate, a first conductive connector and a second conductive connector being on a second side of the substrate, the second side being opposite the first side, a third conductive connector being on the first conductive connector opposite the second side of the substrate, and a fourth conductive connector being on the third conductive connector opposite the second side of the substrate, wherein the mask comprises a light-blocking layer on a transparent layer;
    projecting a first laser beam on a first region of the first side of the substrate through a first opening in the mask, wherein the first conductive connector and the third conductive connector are reflowed by heat produced by the first laser beam; and
    after the first conductive connector solidifies, projecting a second laser beam on a second region of the first side of the substrate through a second opening in the mask, the first region being surrounded by the second region, wherein the second conductive connector and the fourth conductive connector are reflowed by heat produced by the second laser beam.

14. The method of claim 13, wherein the first laser beam passes through an annular opening in the light-blocking layer.

15. The method of claim 13, wherein the first laser beam passes through a round opening in the light-blocking layer.

16. The method of claim 13, wherein the first laser beam passes through a partially transparent portion of the light-blocking layer.

17. The method of claim 16, wherein the partially transparent portion is transparent to laser light in a range of 10% to 60%.

18. The method of claim 13, wherein the first laser beam passes through a first rectangular opening in the light-blocking layer.

19. The method of claim 18, wherein the first laser beam passes through a second rectangular opening in the light-blocking layer, the second rectangular opening being separated from the first rectangular opening by a distance in a range of 5 mm to 40 mm.

20. The method of claim 19, wherein the first laser beam passes through a partially transparent portion of the light-blocking layer, the partially transparent portion being between the first rectangular opening and the second rectangular opening.

* * * * *